United States Patent [19]
McClure

[11] Patent Number: 5,861,660
[45] Date of Patent: *Jan. 19, 1999

[54] INTEGRATED-CIRCUIT DIE SUITABLE FOR WAFER-LEVEL TESTING AND METHOD FOR FORMING THE SAME

[75] Inventor: David C. McClure, Carrollton, Tex.

[73] Assignee: STMicroelectronics, Inc., Carrollton, Tex.

[*] Notice: This patent issued on a continued prosecution application filed under 37 CFR 1.53(d), and is subject to the twenty year patent term provisions of 35 U.S.C. 154(a)(2).

[21] Appl. No.: 710,356

[22] Filed: Sep. 17, 1996

Related U.S. Application Data

[63] Continuation-in-part of Ser. No. 484,609, Aug. 21, 1995, Pat. No. 5,557,573.

[51] Int. Cl.$^6$ .................................................. H01L 23/544
[52] U.S. Cl. ............................................. 257/620; 257/208
[58] Field of Search ................................. 257/385, 620, 257/635, 637, 700, 208; 438/113, 114, 68; 365/200, 201

[56] References Cited

U.S. PATENT DOCUMENTS

| | | | |
|---|---|---|---|
| 4,651,304 | 3/1987 | Takata | 365/201 |
| 5,208,776 | 5/1993 | Nasu et al. | 365/200 |
| 5,212,394 | 5/1993 | Iwasaki et al. | 257/620 |
| 5,300,816 | 4/1994 | Lee et al. | 257/797 |
| 5,339,277 | 8/1994 | McClure | 365/230.08 |
| 5,341,336 | 8/1994 | McClure | 365/201 |
| 5,349,219 | 9/1994 | Murao et al. | 257/208 |
| 5,402,318 | 3/1995 | Otsuka et al. | 257/691 |
| 5,459,688 | 10/1995 | Pfiester et al. | 365/182 |
| 5,466,952 | 11/1995 | Moody | 257/139 |
| 5,471,430 | 11/1995 | Sawada | 365/222 |
| 5,539,325 | 7/1996 | Rostoker et al. | 324/763 |
| 5,548,135 | 8/1996 | Avery | 257/173 |
| 5,593,927 | 1/1997 | Farnworth et al. | 437/209 |
| 5,629,557 | 5/1997 | Yamaha | 257/620 |

FOREIGN PATENT DOCUMENTS

| | | | |
|---|---|---|---|
| 0363179 | 4/1990 | European Pat. Off. | 257/620 |
| 62-76639 | 4/1987 | Japan | 257/620 |
| 62-209829 | 8/1987 | Japan | 257/620 |
| 1-0006320 | 1/1989 | Japan . | |
| 1-6320 | 7/1990 | Japan . | |
| 3-72653 | 3/1991 | Japan | 257/620 |
| 3-0197565 | 8/1991 | Japan . | |
| 5-259165 | 3/1992 | Japan | 257/620 |
| 5041429 | 2/1993 | Japan . | |
| 5-267257 | 10/1993 | Japan | 257/620 |
| 6-45315 | 2/1994 | Japan | 257/620 |
| 6-77315 | 3/1994 | Japan | 257/620 |

OTHER PUBLICATIONS

"Wafer Burn–In Isolation Circuit," *IBM Technical Disclosure Bulletin*, 32(6B):442–443, Nov. 1989.

Bove et al., "Impedance Terminator For AC Testing Monolithic Chips," *IBM Technical Disclosure Bulletin*, 15(9):2681–2682, Feb. 1973.

"Wafer Level Test and Burn–In," *IBM Technical Disclosure Bulletin*, 33(8):1–2, Jan. 1991.

*Primary Examiner*—Olik Chaudhuri
*Assistant Examiner*—Phat X. Cao
*Attorney, Agent, or Firm*—David V. Carlson; Theodore E. Galanthay; Lisa K. Jorgenson

[57] ABSTRACT

A semiconductor integrated-circuit die includes a substrate of semiconductor material that has an edge. A conductive layer is disposed on the substrate, and a first insulator layer is disposed between the said substrate and the conductive layer. A functional circuit is disposed in the die. A conductive path is disposed beneath the insulator layer and is coupled to the circuit, the conductive path having an end portion that is located substantially at the edge of the substrate. The wafer on which the die is disposed has one or more signal lines that run along the scribe lines of the wafer. Before the die is scribed from the wafer, the conductive path couples the circuit on the die to one of these signal lines. The end portion of the conductive path is formed when the die is scribed from the wafer.

9 Claims, 11 Drawing Sheets

INTEGRATED-CIRCUIT DIE SUITABLE FOR WAFER-LEVEL TESTING AND METHOD FOR FORMING THE SAME

CROSS-REFERENCE TO PRIOR APPLICATION

The present application is a continuation-in-part application of U.S. application Ser. No. 484,609, filed Aug. 21, 1995, now U.S. Pat. No. 5,557,573, issued Sep. 17, 1996.

The following pending U.S. Patent Applications by David C. McClure entitled: "Circuit and Method for Replacing a Defective Memory Cell With a Redundant Memory Cell," Ser. No. 08/758,582, filed Nov. 27, 1996, "Memory Having and Method for Testing Redundant Memory Cells," Ser. No. 08/758,586, filed Nov. 27, 1996, "Integrated Circuit That Supports and Method For Wafer-Level Testing," Ser. No. 08/710,357 filed Sep. 17, 1996, and "Circuit and Method for Selecting a Signal," Ser. No. 08/758,587, filed Nov. 27, 1996 have the same ownership as the present application and to that extent are related to the present application, and are incorporated herein by reference.

TECHNICAL FIELD

The present invention relates generally to integrated semiconductor devices, and more specifically to a semiconductor die having one or more conductive paths that extend to the edge of the die and that are electrically coupled to corresponding conductive paths on the wafer before the die is scribed therefrom.

BACKGROUND OF THE INVENTION

To improve the reliability of integrated circuits such as memory devices, engineers have developed many stressing and testing procedures to identify defective integrated circuits before they are shipped to customers. Typically, an integrated circuit is formed on a section of a wafer of semiconductor material, such as silicon. Each such section is called a die, and wafer includes multiple dies. For example, a wafer having an 8-inch diameter may include up to 600 individual dies. After the integrated circuits have been formed, the dies are detached, i.e., cut, removed, or scribed, from the wafer along scribe lines. The engineers then subject the individual integrated circuits to the desired testing and stressing procedures. Alternatively, the scribed dies may be packaged before the engineers test the integrated circuits. Integrated circuits that are tested in die form, i.e., before they are packaged, may be packaged after testing and then shipped to customers, or may be shipped to customers in die form, i.e., as known good dies.

The initial stressing of the integrated circuit, often called burn-in, accelerates the physical changes that the circuit would otherwise experience during normal operation, so that a defect that would occur after a number of hours of normal operation often occurs after significantly fewer hours of burn-in. After the completion of the burn-in, engineers test the integrated circuit for defects before it is shipped to a customer. If the engineers find a defect, they may repair the defect if such a repair is possible, or they may discard the defective integrated circuit.

One stressing and testing procedure includes placing a memory circuit into an oven that has a temperature well above room temperature, and then applying to the memory cells within the memory circuit test voltages that are well above the normal operating voltages. To reduce the time of such a procedure, engineers have developed a number of test circuits that are formed as part of the memory circuit and that allow the simultaneous selection of multiple memory cells during the procedure. Examples of such test circuits are described in U.S. patent application Ser. No. 07/954,276, entitled "Stress Test For Memory Arrays In Integrated Circuits," filed Sep. 30, 1992, U.S. Pat. No. 5,341,336, entitled "Method For Stress Testing Decoders And Periphery Circuits," and U.S. Pat. No. 5,339,277, entitled "Address Buffer," which are incorporated by reference.

One problem with known stressing and testing procedures such as the one described above is that they may cause a substantial bottle neck in the overall production of integrated circuits. For example, the number of signal probes that must be coupled to each integrated circuit during stressing and testing often limits the number of integrated circuits that a test station can stress and test at one time. For some large-capacity memory devices, such stress and testing procedures may take approximately 100 hours. Therefore, to decrease the overall stress-test time, one often must use more test stations. However, the size and cost of a test station often makes acquiring additional test stations impractical or impossible. Additionally, if an integrated circuit is stressed and tested after it has been packaged and is found to be defective, the packaging is either removed to allow the repair of the defective circuit, or the defective circuit, package and all, is discarded. Thus, the packaging time and materials are wasted on the defective circuit.

SUMMARY OF THE INVENTION

In accordance with one aspect of the present invention, a semiconductor die includes a substrate of semiconductor material that has an edge. A conductive layer is disposed on the substrate, and a first insulator layer is disposed between the substrate and the conductive layer. A circuit is disposed in the die. A conductive path is disposed beneath the insulator layer and is coupled to the circuit, the conductive path having a portion that is located substantially at the edge of the substrate.

In another aspect of the invention, the wafer on which the die is formed has one or more signal lines that run along the wafer scribe lines. Before the die is scribed from the wafer, the conductive path couples the circuit on the die to one of these signal lines.

By routing the wafer test-mode and wafer power-supply signals on the wafer instead of via signal probes that are coupled to each integrated circuit, an advantage provided by the present invention includes an increase in the number of integrated circuits that a test station can simultaneously stress and test. Furthermore, in addition to allowing the stressing and testing of integrated circuits at the die level, i.e., before the integrated-circuit dies have been packaged, the present invention also allows the stressing and testing of the integrated circuits at the wafer level, i.e., before the integrated-circuit dies have been scribed from the wafer. Therefore, such wafer-level testing may allow one to ship wafers-full of circuits to customers, who will scribe the dies and then package them or use the bare dies in accordance with their own needs.

BRIEF DESCRIPTION OF THE DRAWINGS

FIG. 21 is a block diagram of a computer system that incorporates the integrated circuit of FIG. 1.

DETAILED DESCRIPTION OF THE INVENTION

Figure 1:
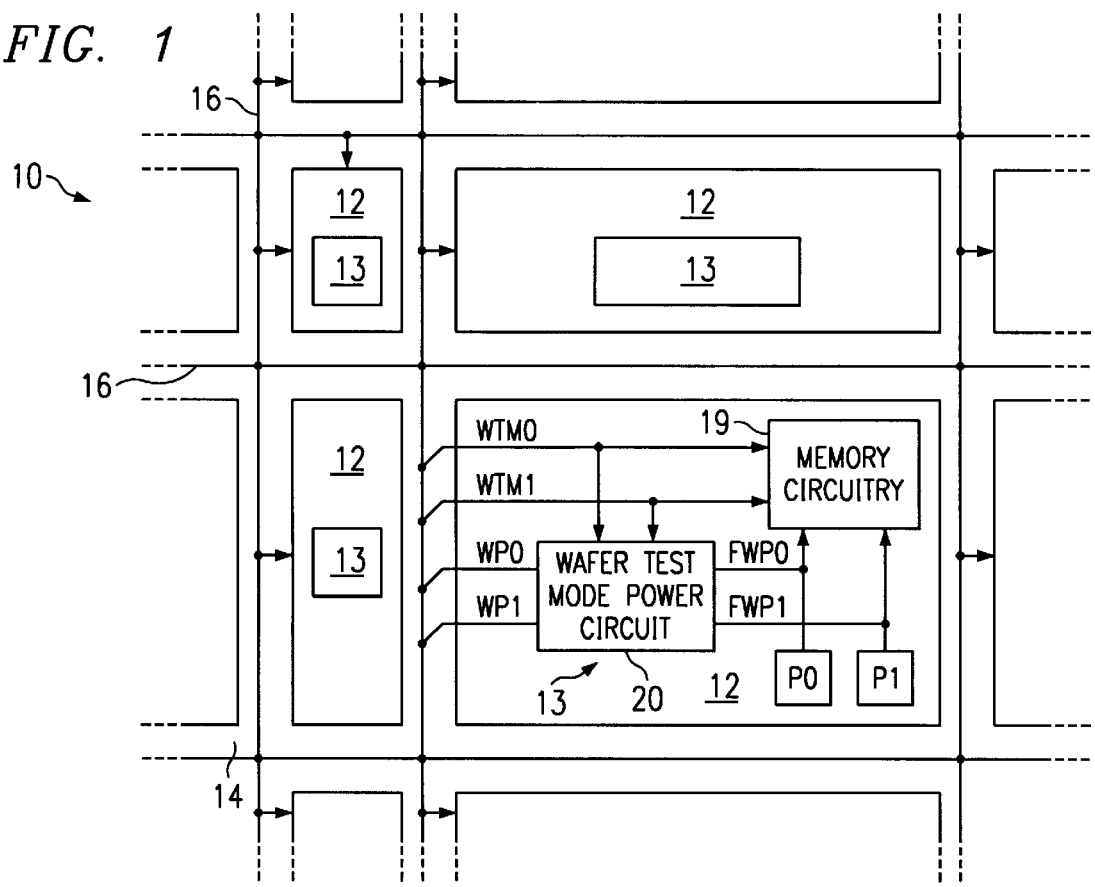
FIG. 1 is a schematic diagram of a portion of a semiconductor wafer according to the invention.

FIG. 1 is a schematic diagram of a region of a semiconductor wafer 10, which is formed according to the present invention. The wafer 10 is formed from a semiconductor material such as monocrystalline silicon, and includes a number of dies 12, which have integrated circuits 13 formed thereon. The dies 12 are separated from one another by scribe sections or lines 14. A wafer test bus 16 is formed in the scribe lines 14. The bus 16 may be continuous, or may be divided into sections that can be electrically isolated from one another in a conventional manner such that the dies 12 coupled to one section may be electrically isolated from the dies 12 coupled to other sections. In the illustrated embodiment of the invention, the bus 16 includes four paths or lines that respectively carry wafer test-mode signals WTM0 and WTM1 and wafer power signals WP0 and WP1, and that are respectively coupled to corresponding wafer test paths or lines on each of the dies 12. For clarity, these four paths and the details of the integrated circuit 13 are shown for only one die 12, it being understood that the circuits 13 of the remaining dies 12 have a similar circuit layout. WTM0, WTM1, WP0, and WP1 allow stressing and testing of the circuits 13 while the wafer 10 is still intact, Le., before the dies 12 are scribed from the wafer 10.

Because it need only probe the circuits 13 via the bus 16 and not individually, a testing station (not shown) can use significantly fewer probes than when testing the circuits 13 after the dies 12 have been scribed from the wafer 10. Thus, the invention allows a testing station to test significantly more circuits 13 simultaneously than it could if the dies 12 were first scribed from the wafer 10. Furthermore, the invention allows the sale of stressed and tested circuits 13 before the dies 12 have been scribed from the wafer 10, i.e., the sale of a wafer 10 full of circuits 13. The sale of the circuits 13 in wafer form provides a convenient way to ship the circuits 13 and makes it easier for a customer to use the circuits 13 in custom hybrid circuits that may include multiple dies within a single package.

More specifically, each of the integrated circuits 13 formed on the dies 12 includes functional circuitry 19, which performs the functions for which the integrated circuit 13 is designed, and a wafer test-mode power circuit 20. For example purposes, the functional circuitry 19 is shown as a memory circuit 12, although other types of functional circuitry may be used. During wafer-level stressing and testing of the circuit 13 and in response to the signals WTM0 and WTM1, the memory circuit 19 operates in different wafer-level test modes of operation, and the power circuit 20 generates and couples to supply pads P0 and P1 functional-circuitry supply signals FWP0 and FWP1. If the integrated circuit 13 is defective such that it draws excessive supply current from either FWP0 or FWP1, the power circuit 20 is disabled such that it does not provide signals FWP0 and FWP1 to the memory circuit 19. During operation of the integrated circuit 13 after the die 12 has been scribed from the wafer 10, the wafer power circuit 20 is disabled, and supply voltages for the functional circuitry 18 are coupled directly to the supply pads P0 and P1.

Figure 2:
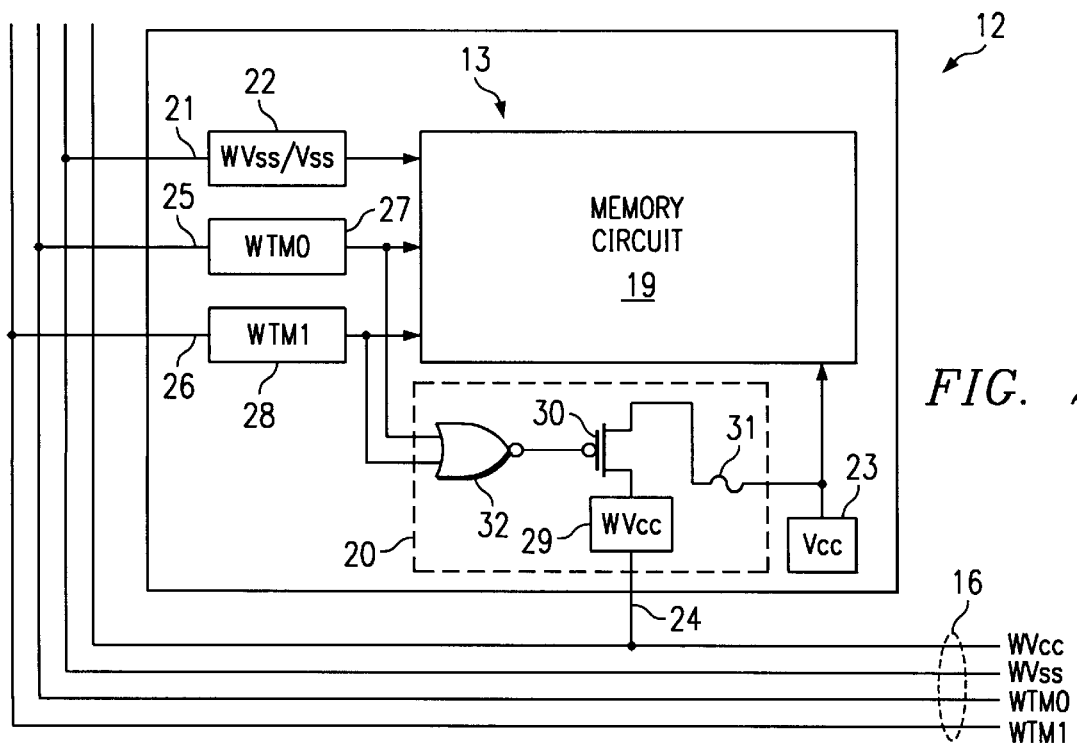
FIG. 2 is a schematic diagram of an integrated circuit that includes a first embodiment of the wafer test-mode power circuit of FIG. 1.

FIG. 2 is a schematic diagram of the integrated circuit 13 having a first embodiment of the wafer test-mode power circuit 20 of FIG. 1. The circuit 20 is suitable for use with a circuit 13 having a p-type substrate. The memory circuit 19 may be any type of memory device, such as a 32K×32 Burst Static Random Access Memory (Burst SRAM), that is formed on the same die 12 as the power circuit 20. The bus 16 includes four lines that respectively carry WTM0 and WTM1 and wafer power signals WVcc and WVss. WVss is directly coupled to the memory circuit 19 via a conductive path 21 that includes a WVss/Vss pad or terminal 22, and WVcc is coupled to the memory circuit 19 and an isolatable Vcc pad 23 via a conductive path 24 and the power circuit 20. WTM0 and WTM1 are respectively coupled to the memory circuit 19 and the power circuit 20 via conductive paths 25 and 26, which respectively include WTM0 and WTM1 pads 27 and 28. The power circuit 20 includes a WVcc pad 29, which receives WVcc from the path 24, and a switch 30, here a PMOS transistor, which selectively couples the pad 29 to the memory circuit 19 via a selectively conductive element 31. The selectively conductive element may be a laser fuse, electrical fuse, programmable memory cell, or other conventional selectively conductive element. A NOR gate 32 receives WTM0 and WTM1 from the pads 27 and 28 respectively, and controls the switch 30 in response thereto.

During the wafer-level stressing and testing of the memory circuit 19, WTM0 and WTM1 have logic values that correspond to the stressing and testing states of the memory circuit 19 as shown in Table 1.

TABLE 1

| WTM 0 | WTM 1 | Status of the memory circuit 19 |
|---|---|---|
| 0 | 0 | Normal operation |
| 0 | 1 | Stress/Test (simultaneously write 0's to all memory cells in the memory array) |
| 1 | 0 | Stress/Test (simultaneously write 1's to all memory cells in the memory array) |
| 1 | 1 | Stress/Test (unselect the memory array) |

Referring to Table 1, if WTM0 and WTM1 are both logic 0, the memory circuit 19 is in a normal mode of operation, and if at least one of WTM0 and WTM1 is logic 1, the memory circuit 19 is in a stress/test mode of operation. Specifically, there are three different stress/test modes. If WTM0 is logic 0 and WTM1 is logic 1, the row and column decoders (not shown in FIG. 2) simultaneously address, i.e., select, the entire array of memory cells (not shown in FIG. 2), and the write drivers (not shown in FIG. 2) simultaneously write a logic 0 to each of the memory cells in the array. If WTM0 is logic 1 and WTM1 is logic 0, the row and column decoders simultaneously select the entire array of memory cells, and the write drivers simultaneously write a logic 1 to each of the memory cells. In one aspect of the invention, the voltage associated with logic 1 may be higher than that used during normal operation of the memory circuit 19. For example, logic 1 may equal 5 volts (V) during normal operation, but may equal 7–9 V during the wafer stressing and testing procedure. If both WTM0 and WTM1 are logic 1, the row and column decoders do not select any memory cells, and thus the write drivers do not write data to any of the memory cells.

In operation during wafer-level stressing and testing, when one or both of WTM0 and WTM1 is logic 1, the output of the NOR gate 32 is logic 0, which activates the PMOS transistor 30. The active transistor 30 couples WVcc to the memory circuit 19. Thus, the memory circuit 19 receives power so that it can operate in the various stress/test modes as discussed above in conjunction with Table 1. At the beginning of the wafer stressing and testing procedure, the testing station monitors the total current that the circuits 13 draw from WVcc and WVss. If the total current draw is excessive due to a short circuit or other defect, then the circuits 13 are individually tested to determine which one or ones are defective. The defective circuits 13 are then electrically isolated from the circuits 13 on the wafer 10 to prevent them from interfering with the wafer-level stressing and testing of the remaining circuits 13. To electrically isolate the defective circuits 13, the selectively conductive element 31 is made nonconductive on all of the defective circuits 13.

During normal operation of the memory circuit 19, both WTM0 and WTM1 are logic 0, and the NOR gate 32 generates at its output a logic 1, which deactivates the transistor 30. The inactive transistor 30 thus uncouples the memory circuit 19 from the line 24 and the pad 29. As stated above, however, the memory circuit 19 receives power from supply voltages Vss and Vcc, which are directly coupled to the pads 22 and 23, respectively.

Equating the normal mode of operation with WTM0= WTM1=logic 0 prevents a short circuit between any of the lines 21, 24, 25, and 26 and the substrate of the integrated circuit 13 from causing the memory circuit 19 to malfunction during the normal mode of operation. The integrated circuit 13 includes a p-type silicon substrate in which many components of the memory circuit 19 are formed. To ensure that all of the NMOS transistors that are formed in the p-type substrate have stable and predictable threshold voltages, the substrate is coupled to the low supply voltage Vss, which is usually 0 V, i.e., ground. During the scribing of the dies 12 from the wafer 10, a short circuit may develop between one or more of the lines 21, 24, 25, and 26 and the substrate, and thus between one or more of these lines and Vss. However, because they are held at logic 0, which is equivalent to Vss, during normal operation of the memory device 19, the lines 25 and 26 are already effectively short circuited to the substrate, and thus a short circuit between either of these lines and the substrate has no adverse affect on the operation of the memory device 19 or the power circuit 20. Furthermore, because it is coupled to Vss via the pad 22, the line 21 is already effectively short circuited to the substrate, and thus an actual short circuit between the line 21 and the substrate has no adverse affect on the operation of the memory circuit 19 and the power circuit 20. Additionally, because during normal operation the lines 25 and 26 are held at logic 0 whether or not either of these lines is actually short circuited to the substrate, the NOR gate 32 always generates at its output a logic 1, which deactivates the transistor 30. Thus, the inactive transistor 30 uncouples the line 24 and the pad 29 from the pad 23 and the memory circuit 19, and prevents a short circuit between the line 24 and the substrate from shorting the Vcc to Vss via the pad 23.

After the completion of the wafer-level stressing and testing, the elements 31 in all of the circuits 13 may be made nonconductive to further ensure that the line 24 is isolated from the memory circuit 19.

Figure 3:
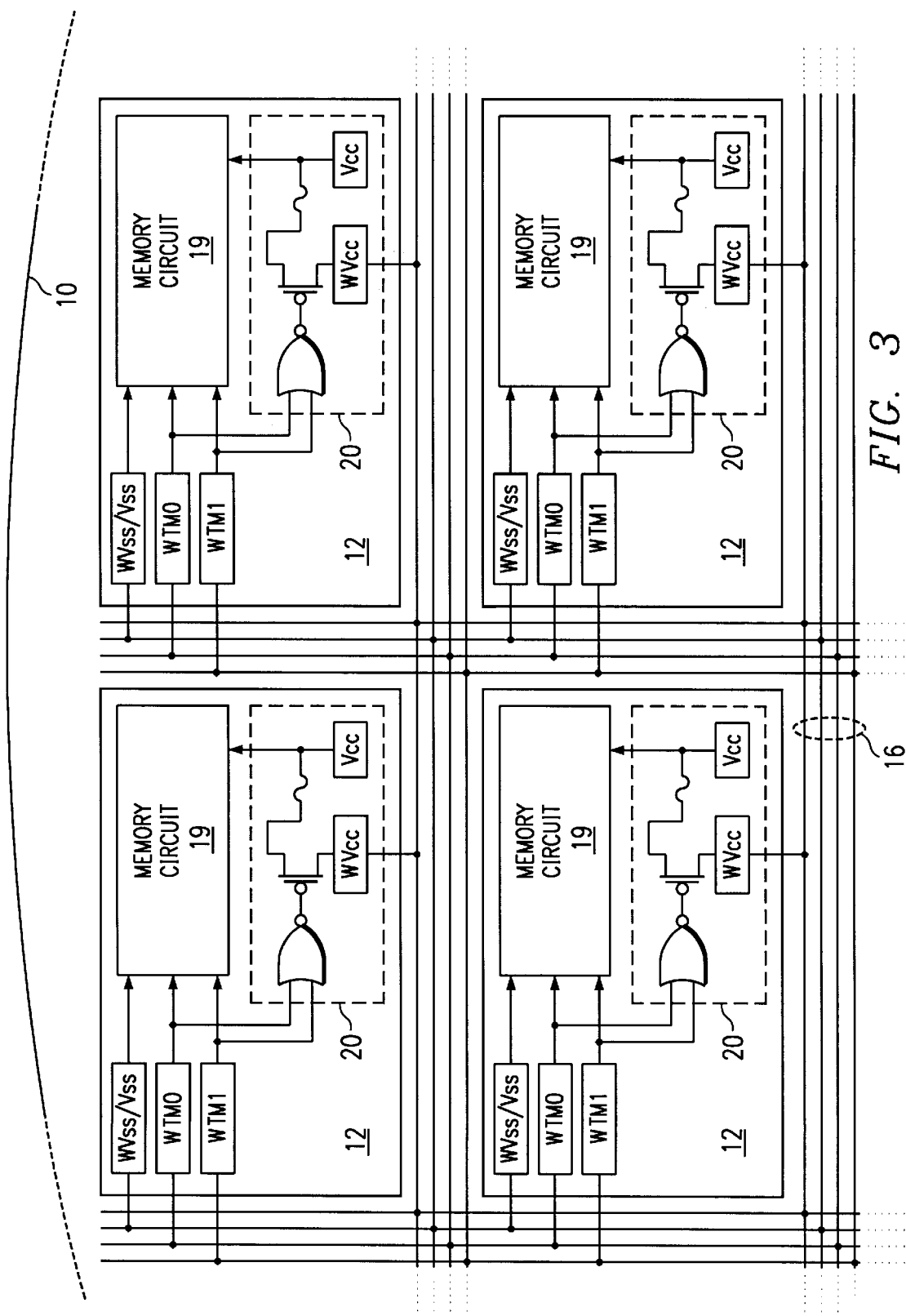
FIG. 3 is a schematic diagram of a portion of the semiconductor wafer of FIG. 1 that includes the integrated circuit of FIG. 2.

FIG. 3 is a schematic diagram of a portion of the wafer 10 of FIG. 1 that includes dies 12 having the integrated circuits 13 of FIG. 2.

Figure 4:
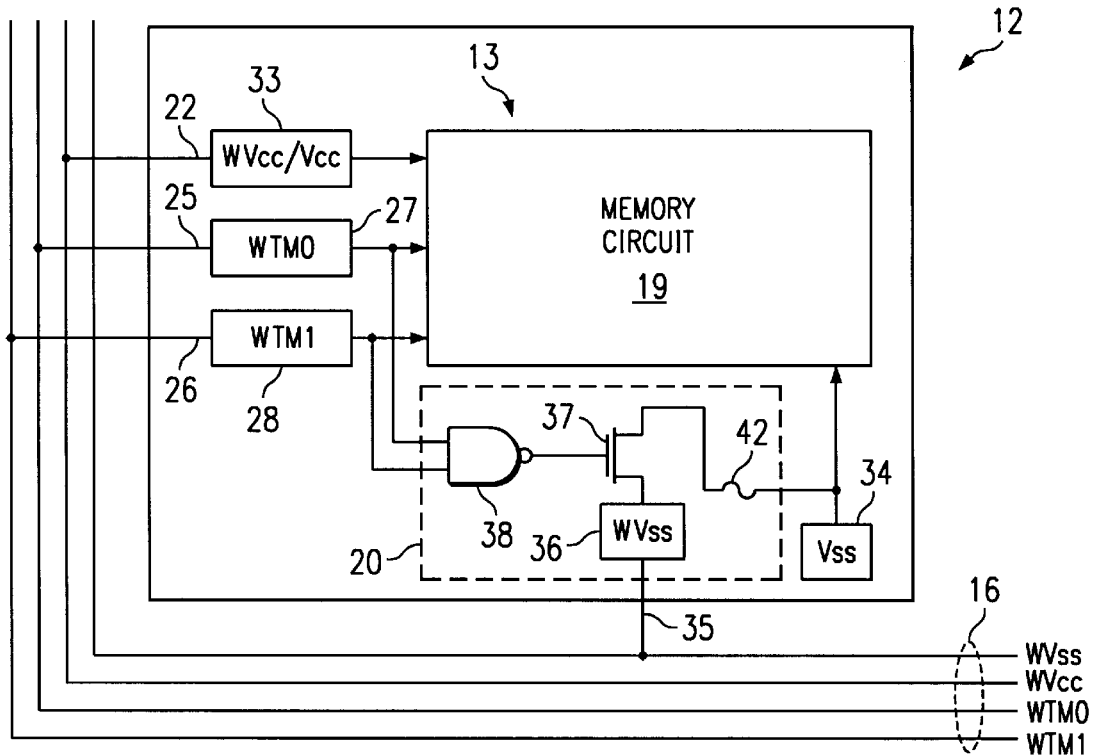
FIG. 4 is a schematic diagram of an integrated circuit that includes a third embodiment of the wafer test-mode power circuit of FIG. 1.

FIG. 4 is a schematic diagram of an integrated circuit 13 that incorporates a second embodiment of the wafer test-mode power circuit 20 of FIG. 1. This embodiment of the power circuit 20 is suitable for use with a circuit 13 having an n-type substrate. WVcc is directly coupled to the memory circuit 19 via a conductive path 32, which includes a WVcc/Vcc pad 33, and WVss is coupled to the memory circuit 19 and an isolatable Vss pad 34 via a conductive path 35 and the power circuit 20. WTM0 and WTM1 are respectively coupled to the memory circuit 19 and the power circuit 20 via conductive paths 25 and 26, which respectively include WTM0 and WTM1 pads 27 and 28. The power circuit 20 includes a WVss pad 36, which receives WVss from the path 35, and a switch 37, here an NMOS transistor, which selectively couples the pad 36 to the memory circuit 19 via a selectively conductive element 42. A NAND gate 38 receives WTM0 and WTM1 from the pads 27 and 28 respectively, and controls the switch 37 in response thereto.

During the wafer-level stressing and testing of the memory circuit 19, WTM0 and WTM1 have logic values that correspond to the stressing and testing states of the memory circuit 19 as shown in Table 2.

TABLE 2

| WTM 0 | WTM 1 | Status of the memory circuit 19 |
|---|---|---|
| 0 | 0 | Stress/Test (unselect the memory array) |
| 0 | 1 | Stress/Test (simultaneously write 0's to all memory cells in the memory array) |
| 1 | 0 | Stress/Test (simultaneously write 1's to all memory cells in the memory array) |
| 1 | 1 | Normal operation |

Referring to Table 2, if both WTM0 and WTM1 are logic 1, the memory circuit 19 is in the normal mode of operation, and if at least one of WTM0 and WTM1 is logic 0, the memory circuit 19 is in one of three stress/test modes of operation as discussed above in conjunction with FIG. 2. If WTM0 is logic 0 and WTM1 is logic 1, the write drivers of the memory circuit 19 simultaneously write a logic 0 to each of the memory cells in the array. If WTM0 is logic 1 and WTM1 is logic 0, the write drivers simultaneously write a logic 1 to each of the memory cells. As stated above in conjunction with FIG. 2, the voltage associated with logic 1 may be higher than that used during normal operation of the memory circuit 19. If both WTM0 and WTM1 are logic 0, the write drivers do not write data to any of the memory cells.

In operation during wafer-level stressing and testing, when one or both of WTM0 and WTM1 is logic 0, the output of the NAND gate 38 is logic 1, which activates the NMOS transistor 37. The active transistor 37 couples WVss to the memory circuit 19. Thus, the memory circuit 19 receives power so that it can operate in the various stress/test modes as dictated by WTM0 and WTM1. At the beginning of the wafer test, the testing station monitors the combined current that the circuits 13 draw from WVcc and WVss. If the combined current draw is excessive due to a short circuit or other defect, then circuits 13 are individually tested to determine which one or ones are defective, and the defective circuits 13 are electrically isolated from the remaining circuits 13. To electrically isolate the defective circuits 13, the selectively conductive element 42 is made nonconductive in all the defective circuits 13.

During normal operation of the memory circuit 19, both WTM0 and WTM1 are logic 1, and the NAND gate 32 generates at its output a logic 0, which deactivates the transistor 37. The inactive transistor 37 thus uncouples the memory circuit 19 from the line 35 and the pad 36. As stated above, however, the memory circuit 19 receives power from the supply voltages Vss and Vcc, which are coupled to the pads 33 and 34, respectively.

Equating the normal mode of operation with WTM0=WTM1=logic 1 prevents a short circuit between any of the lines 25, 26, 32 and 35 and the n-type substrate of the integrated circuit 13 from adversely affecting the normal operation of the memory circuit 19. To ensure that all of the PMOS transistors that are formed in the n-type substrate have stable and predictable threshold voltages, the substrate is coupled to the high supply voltage Vcc, which for example is 5 V. During the scribing of the dies 12 from the wafer 10, a short circuit may develop between one or more of the lines 25, 26, 32, and 35 and the substrate, and thus between one or more of these lines and Vcc. However, because they are held at logic 1, which is equivalent to Vcc, during normal operation of the memory device 19, the lines 25 and 26 are already effectively short circuited to the substrate, and thus an actual short circuit between either of these lines and the substrate has no adverse affect the operation of the memory device 19 or the power circuit 20. Furthermore, because it is coupled to Vcc via the pad 33, the line 32 is already effectively short circuited to the substrate, and thus an actual short circuit between the line 32 and the substrate has no adverse affect on the operation of the memory circuit 19 and the power circuit 20. Additionally, because during normal operation the lines 25 and 26 are held at logic 1 whether or not either of these lines is actually short circuited to the substrate, the NAND gate 32 always generates at its output a logic 0, which deactivates the transistor 37. Thus, the inactive transistor 37 uncouples the line 35 and the pad 36 from the pad 34 and the memory circuit 19, and prevents a short circuit between Vcc and Vss.

After the completion of the wafer-level stressing and testing, the elements 42 in all of the circuits 13 may be made nonconductive to further ensure that the line 35 is electrically isolated from the memory circuit 19.

Figure 5:
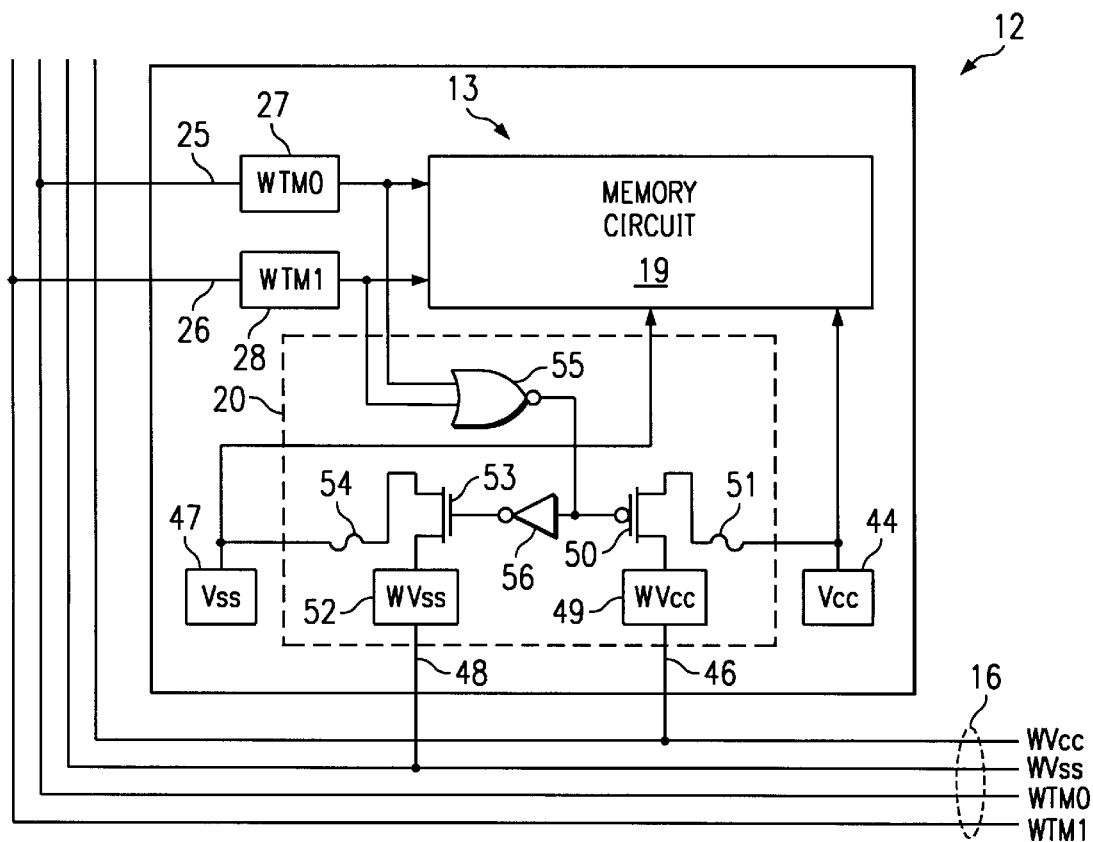
FIG. 5 is a schematic diagram of an integrated circuit that includes a third embodiment of the wafer test-mode power circuit of FIG. 1.

FIG. 5 is a schematic diagram of an integrated circuit 13 that incorporates a third embodiment of the wafer test-mode power circuit 20 of FIG. 1. This embodiment of the circuit 20 is suitable for use in a circuit 13 that has a p-type substrate that is biased to a negative voltage Vbb, which is typically between −1 and −3 volts. Vbb may be supplied to the integrated circuit 13 from an external source, or may be generated by a charge pump (not shown) that is part of the integrated circuit 13. WVcc is coupled to the memory circuit 19 and an isolatable Vcc pad 44 via a conductive path 46 and the power circuit 20, and WVss is coupled to the memory circuit 19 and an isolatable Vss pad 47 via a conductive path 48 and the power circuit 20. WTM0 and WTM1 are respectively coupled to the memory circuit 19 and the power circuit 20 via conductive paths 25 and 26, which respectively include WTM0 and WTM1 pads 27 and 28. The power circuit 20 includes a WVcc pad 49, which receives WVss from the path 46, and a switch 50, here a PMOS transistor, which selectively couples the pad 49 to the memory circuit 19 via a first selectively conductive element 51. The power circuit 20 also includes a WVss pad 52, which receives WVss from the path 48, and a switch 53, here an NMOS transistor, which selectively couples the pad 52 to the memory circuit 19 via a second selectively conductive element 54. A NOR gate 55 receives WTM0 and WTM1 from the pads 27 and 28 respectively, and controls the transistors 50 and 53 in response thereto. The output of the NOR gate 55 is coupled directly to the gate of the transistor 50, and is coupled through an inverter 56 to the gate of the transistor 53.

During wafer-level stressing and testing, WTM0 and WTM1 have the same values as shown in Table 1 above, and thus the memory circuit 19 has the same states as discussed above in conjunction with FIG. 2. Thus, when at least one of the signals WTM1 and WTM0 is logic 1, the NOR gate 55 outputs a logic 0, which activates the PMOS transistor 50. The active transistor 50 couples WVcc to the memory circuit 19. Furthermore, the inverter 56 inverts the logic 0 from the output of the NOR gate 55 to logic 1, which activates the NMOS transistor 53. The active transistor 53 couples WVss to the memory circuit 19. As discussed above in conjunction with FIGS. 2 and 4, at the beginning of the wafer test, the testing station monitors the total current that the circuits 13 draw from WVcc and WVss. If the combined current draw is excessive due to a short circuit or other defect, then the circuits 13 are individually tested to determine which one or ones are defective. The defective circuits 13 are electrically isolated from the remaining circuits 13 by making each of the elements 51 and 54 nonconductive.

As discussed above in conjunction with FIG. 2, equating the normal mode of operation with WTM0=WTM1=logic 0 prevents a short circuit between any of the lines 25, 26, 46, and 48 and the p-type substrate of the integrated circuit 13 from causing the memory circuit 19 to malfunction during normal operation. To ensure that all of the NMOS transistors that are formed in the p-type substrate have stable and predictable threshold voltages, the substrate is coupled to Vbb as discussed above. Although Vbb is typically lower than Vss, the NOR gate 55 will interpret Vbb as a logic 0. Because they are held at logic 0 during normal operation of the memory device 19, a short circuit between either of the lines 25 and 26 and the substrate has no adverse affect the operation of the memory device 19 or the power circuit 20. Furthermore, the NOR gate 55 always generates at its output a logic 1, which deactivates both transistors 50 and 53. Thus, the inactive transistor 50 uncouples the line 46 and the pad 49 from the pad 44 and the memory circuit 19, and prevents a short circuit between the line 46 and the substrate from adversely affecting the normal operation of the memory circuit 19. Additionally, the inactive transistor 53 uncouples the line 48 and the pad 52 from the pad 47 and the memory circuit 19, and prevents a short circuit between the line 48 and the substrate from adversely affecting the normal operation of the memory circuit 19.

After the completion of the wafer-level stressing and testing, the elements 51 and 54 in all of the circuits 13 may be made nonconductive to further ensure that the lines 46 and 48 are isolated from the memory circuit 19.

Figure 6:
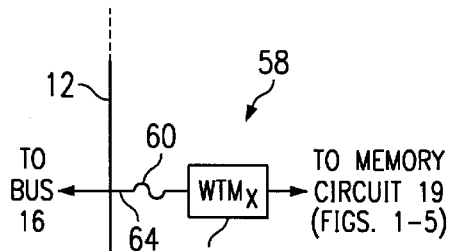
FIG. 6 is a schematic diagram of a first embodiment of a test-mode-pad circuit of FIGS. 2–5.

FIG. 6 is a schematic diagram of a second embodiment of the wafer test-mode pad structures shown in FIGS. 1–5. The pad structure 58 includes a selectively conductive element 60 that is serially coupled between a conductive line 64, which is formed on the die 12 and is coupled to the bus 16, and a wafer test-mode (WTMx) pad 62, which is coupled to a memory circuit 19 as shown in any of the FIGS. 1–5. The element 60 can be made nonconductive to electrically isolate the pad 62 and the memory circuit 19 from the bus 16 before the die 12 is scribed from the wafer 10, or to electrically isolate the pad 62 and the memory circuit 19 from any short circuits between the line 64 and the substrate that may be caused by the scribing of the die 12 from the wafer 10. To maintain the pad 62 at the appropriate logic level during normal operation of the memory circuit 19 as discussed above in conjunction with FIGS. 2–4, and 5, the pad 62 may be bonded to the appropriate supply voltage during the bonding of all the pads on the die 12 to the external pins of the package (not shown).

Figure 7:
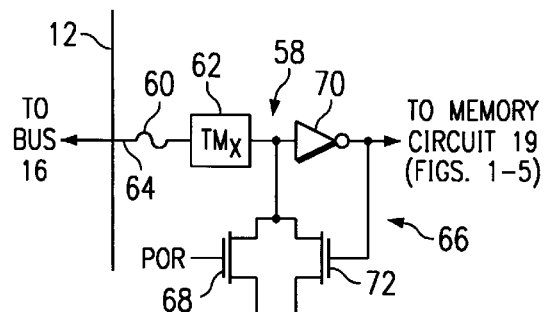
FIG. 7 is a schematic diagram of a second embodiment of a test-mode-pin circuit of FIGS. 2–5.

FIG. 7 is an alternative embodiment of the pad structure 58 of FIG. 6. A latch circuit 66, which includes an inverter 70 and an NMOS transistor 72, and a reset NMOS transistor 68 are coupled to the pad 62 as shown. The selectively conductive element 60 of FIG. 6 may be serially coupled between the line 64 and the pad 62. In operation, during the resetting of the memory circuit 19 a power-on-reset (POR) signal transitions to logic 1 for a predetermined period of time. This logic 1 temporarily turns on the transistor 68, which drives the pad 62 to logic 0. The inverter 70 converts the logic 0 to logic 1, which activates the transistor 72. The active transistor 72 reinforces the logic 0 at the pad 62. At the end of the predetermined time, POR returns to logic 0, thus deactivating transistor 68. However, the feedback loop formed by the inverter 70 and the transistor 72 maintains logic 0 at the pad 62 for an indefinite period of time. Thus, the latch circuit 66 maintains the pad 62 at the appropriate logic level during normal operation of the memory device 19. Although described as maintaining logic 0 on the pad 62, the latch circuit 66 and reset transistor 68 may be designed such that the latch circuit 66 maintains logic 1 on the pad 62.

Figure 8:
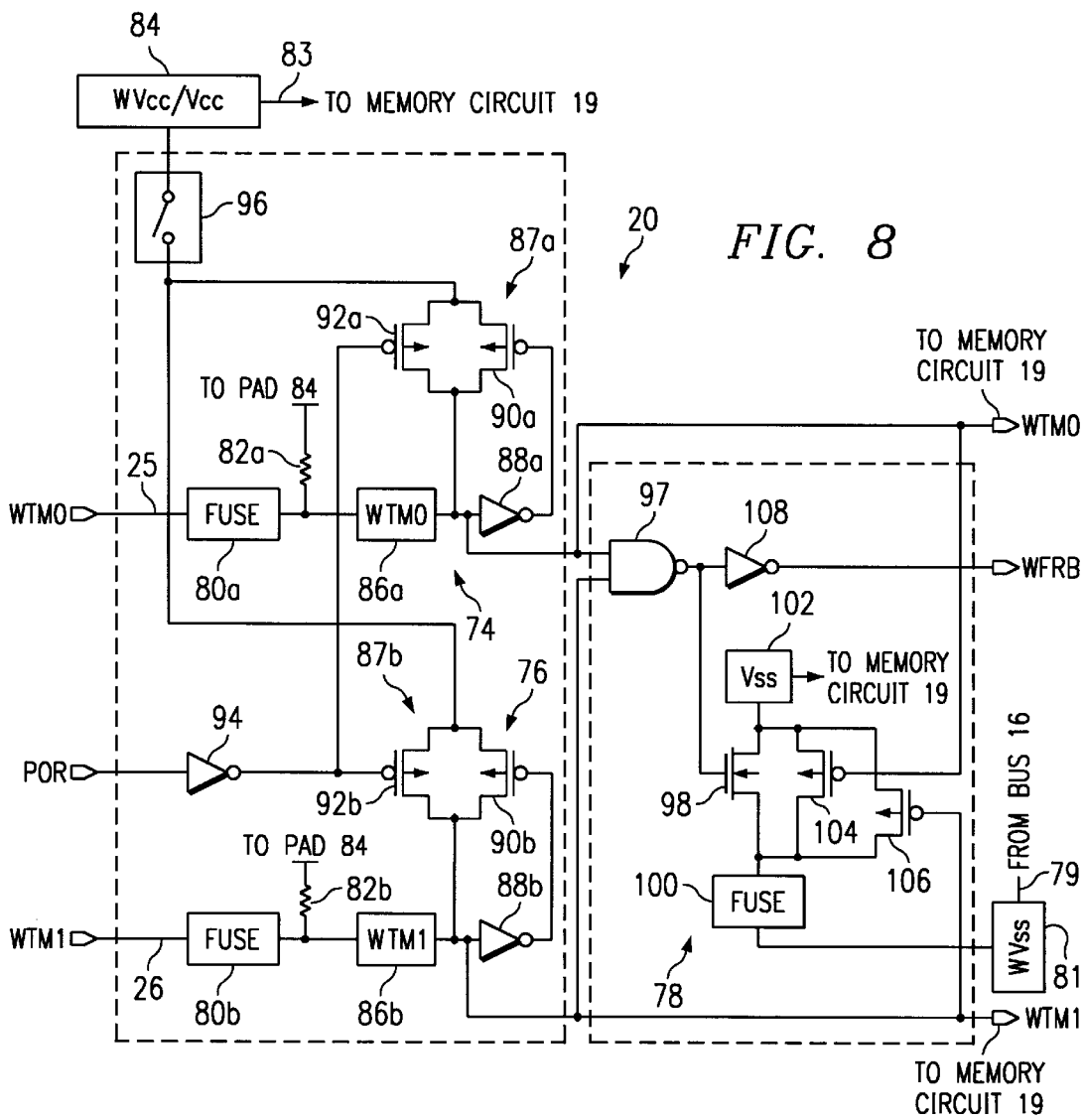
FIG. 8 is a schematic diagram of a fourth embodiment of the wafer test-mode power circuit of FIG. 1.

FIG. 8 is a schematic diagram of a fourth embodiment of the wafer test-mode power circuit 20 of FIG. 1. This embodiment of the circuit 20 is suitable for use in integrated circuits 13 that have a n-type substrate. The circuit 20 includes latch and pull-up circuits 74 and 76, which receive WTM0 and WTM1 on lines 25 and 26 respectively. The circuit 20 also includes a power coupler circuit 78, which during wafer stressing and testing, couples WVss via line 79 and WVss pad 81 to a memory circuit 19 as shown in any of the FIGS. 1–5. During wafer stressing and testing and normal operation, the memory circuit 19 receives WVcc and Vcc, respectively, directly from a line 83 via WVcc/Vcc pad 84.

More specifically, the circuit 74 includes a selectively conductive element 80a, which is coupled between the line 25 and one terminal of a pull-up resistor 82a, the other terminal of which is coupled to the WVcc/Vcc pad 84. In one aspect of the invention, the resistor 82a is formed from polysilicon, and has high impedance on the order of $10^{12}$ ohms. Thus, because the circuitry that drives the line 25 need draw only a relatively small amount of current to pull down the line 25 to logic 0, the high impedance of the resistor 82a allows a relatively large number of circuits 13 to be connected in parallel without overloading the driving circuitry. A WTM0 pad 86a is coupled between the resistor 82a and a latch circuit 87a, which includes an inverter 88a and a PMOS transistor 90a. A reset PMOS transistor 92a is coupled in parallel with the transistor 90a, and has its gate coupled to the signal POR via an inverter 94. An optional switch 96 selectively provides power from the WVcc/Vcc pad 84a to the transistors 90a and 92a. Alternately, the transistors 90a and 92a are hard-wired to receive power at the desired time. The latch and pull-up circuit 76 is constructed in a manner similar to the circuit 74.

The power coupler circuit 78 includes a NAND gate 97, an NMOS transistor 98, which is formed in a p-type well of the n-type substrate, a selectively conductive element 100, and an isolatable Vss pad 102, which are all coupled in a manner that is similar to the coupling of the components of the power circuit 20 of FIG. 4. Additionally, the circuit 78 includes an inverter 104 that generates a signal WFRB from the output of the NAND gate 97, and a pair of PMOS transistors 104 and 106, which are coupled in parallel to the transistor 98 and have their gates respectively coupled to WTM0 and WTM1 respectively. The signal WFRB is discussed further below in conjunction with FIG. 16

During the wafer-level stressing and testing of the memory circuit 19, WTM0 and WTM1 have logic values that correspond to the stressing and testing states of the memory circuit 19 as shown in Table 2.

In operation during wafer-level stressing and testing, when one or both of WTM0 and WTM1 is logic 0, the switch 96 is open, and thus uncouples the transistors 90a and 92a of the circuit 74 from WVcc. If the optional switch 96 is omitted, then the transistors 90a and 92a have no connection to WVcc. Because the latch 87a is not powered and because of he high impedance of the resistor 82a, the drive circuitry coupled to line 25 can pull down line 25 to logic 0 without substantial current loading. The latch and pull-up circuit 76 operates in a manner similar to that of the circuit 74.

Furthermore, the output of the NAND gate 97 is logic 1, which activates the NMOS transistor 98. Before the transistor 98 is fully activated, however, the isolatable VSS pad 102, and thus the p-type well in which the NMOS transistor 98 is formed, may be electrically floating, i.e., the voltage level of the pad 102 and p-type well may be indeterminate. In some circumstances, the indeterminate voltage level of the p-type well affects the threshold of the transistor 98 in an undesirable manner such that the transistor 98 may not fully activate when the output of the NAND gate 97 is logic 1. The PMOS transistors 104 and 106, however, are formed in the n-type substrate, which is coupled to the pad 84 so as to be biased to WVcc. Because the pad 84 is directly coupled to the path 83 and thus to WVcc, the thresholds of the transistors 104 and 106 are at respective desired values before the transistor 98 is active. Furthermore, because at least one of WTM0 and WTM1 is logic 0, at least one of the transistors 104 and 106 is active. The active one or both of the transistors 104 and 106 provides a sufficient coupling between the WVss pad 81 and the isolatable Vss pad 102 such that the threshold of the NMOS transistor 98 is sufficient to allow full activation of the transistor 98 when the output of the NAND gate 97 is logic 1. The NAND gate 97 operates properly when the p-wells formed in the substrate are at an indeterminate voltage level because the transistors (not shown) that generate the logic 1 at the output of the gate 97 are PMOS transistors that are formed in the n-type substrate. As discussed above in conjunction with the transistors 104 and 106, because these transistors are formed in the n-type substrate, their thresholds are at respective desired values.

The fully active transistor 98 couples WVss to the memory circuit 19. Thus, the memory circuit 19 receives power so that it can operate in the various test modes as dictated by WTM0 and WTM1. As discussed above in conjunction with FIGS. 2, 4, and 5, at the beginning of the wafer test, the testing station monitors the total current that the circuits 13 draw from WVcc and WVss. If the total current draw is excessive due to a short circuit or other defect, then circuits 13 are tested individually or in another conventional manner to determine which one or ones are defective, and the selectively conductive element 100 is made nonconductive in all the defective circuits 13.

During normal operation of the memory circuit 19, the levels on both pads 86a and 86b are logic 1. The switch 96 closes to couple the pad 84 to the sources of the transistors 90a and 92a of the circuit 74. In response to the POR signal being a logic 1 during the initialization of the memory circuit 19, the latch 87a operates in a manner similar to that of the latch 66 of FIG. 7 to maintain the pad 86a at logic 1. The latch 87b of the circuit 76 operates in a similar manner to maintain the pad 86b at logic 1. The switch 96 may be controlled with the signals on the pads 86a and 86b, or may be controlled by other conventional circuitry such that the switch 96 is open during wafer stressing and testing and is closed during normal operation of the memory circuit 19. Alternately, in embodiments of the circuit 20 that lack the optional switch 96, the sources of the transistors 90a and 92a are hard-wired to the pad 84 or to another optional or internal pad or node that is coupled to Vcc.

Furthermore, with the levels on pads 84a and 84b being logic 1, the transistors 104 and 106 are inactive, and the NAND gate 97 generates at its output a logic 0, which deactivates the transistor 98. Thus, the inactive transistor 98 uncouples the memory circuit 19 from the line 79 and the pad 81.

Equating the normal mode of operation with WTM0 WTM1=logic 1 provides the same advantages as discussed above in conjunction with the circuit 20 of FIG. 4. Furthermore, after the completion of the wafer-level stressing and testing, the elements 80a, 80b, and 100 in all of the circuits 13 may be made nonconductive to further ensure that the lines 25, 26, and 79 are isolated from the memory circuit 19.

Figure 9:
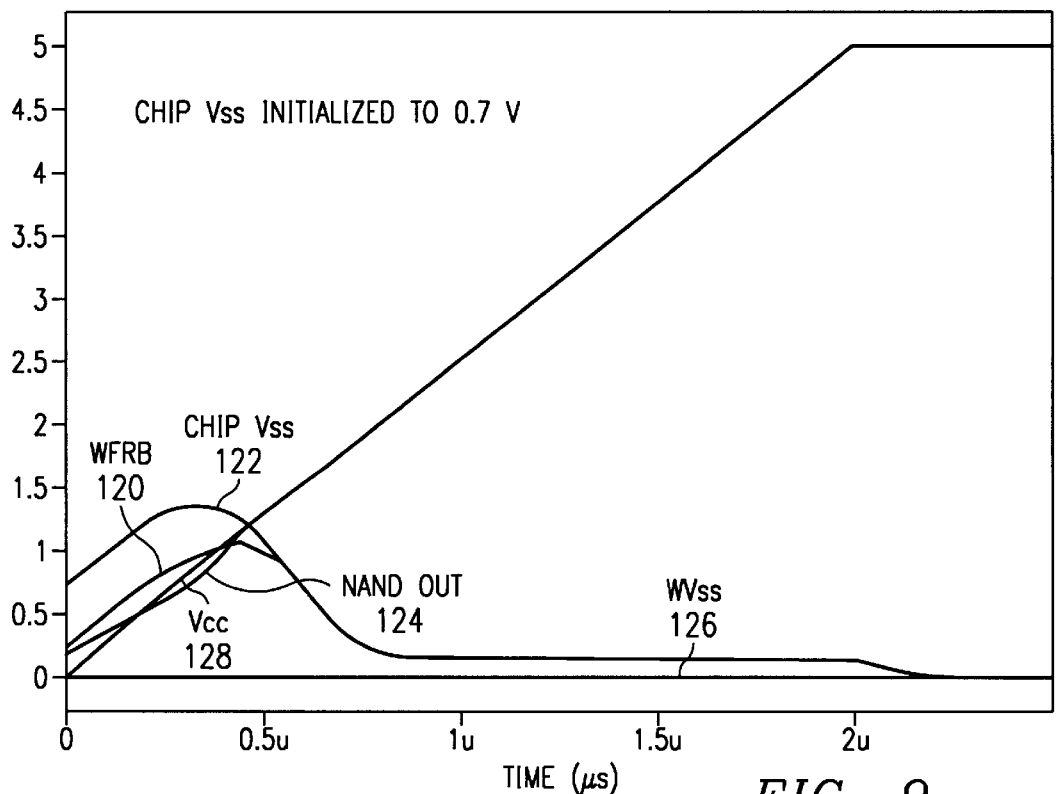
FIG. 9 is a graph showing signal levels at selected nodes of the wafer test-mode power circuit of FIG. 8 when the isolatable power node has a first initial value.

FIG. 9 is a plot of the signals at predetermined nodes of the circuit 20 of FIG. 8 when the pad 102, and thus the p-type well, have an initial voltage of 0.7 V, when WVcc is ramped to 5 V, and when WVss has a steady-state value of 0 V. The plot lines 120, 122, 124, 126, and 128 respectively represent the voltage levels of WFRB, the Vss pad 102, the output of the NAND gate 97, the WVss pad 81, and the WVcc/Vcc pad 84. As shown, the Vss pad 102 becomes equal to the voltage WVss on the pad 81 at approximately the same time that WVcc reaches 5 V. Thus, the plot shows that the transistors 104 and 106 allow the transistor 98 to become fully activate even if the p-type well has an initial voltage that is greater than the desired bias voltage of WVss.

Figure 10:
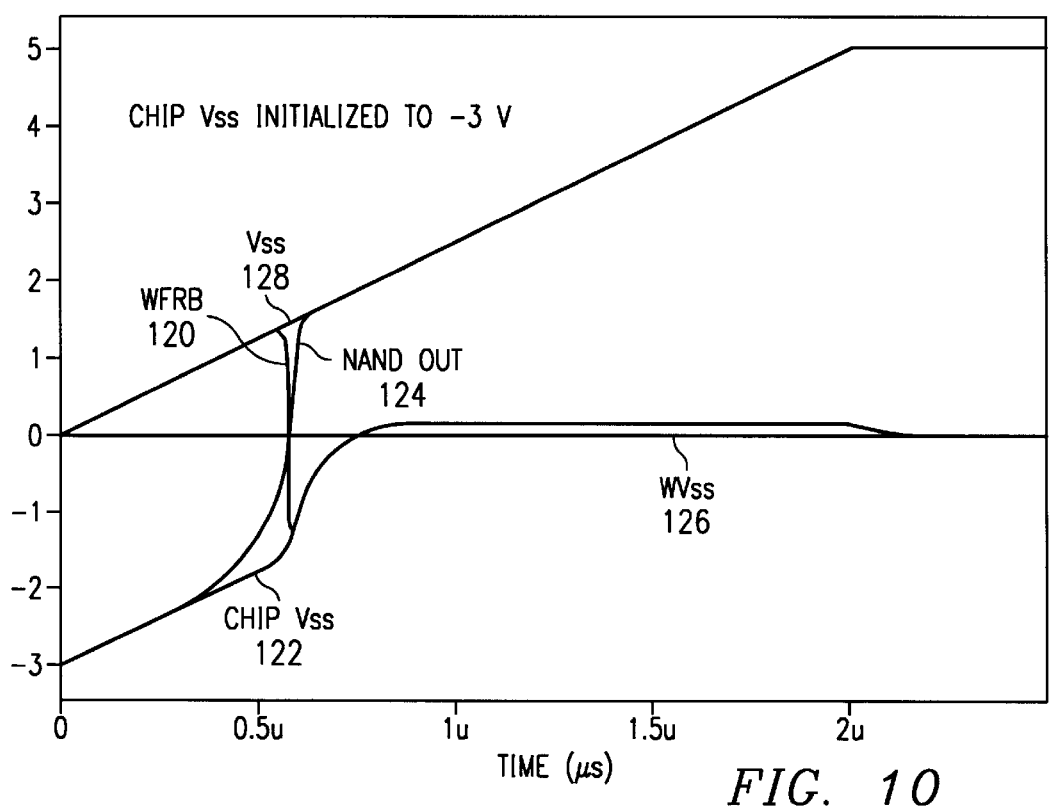
FIG. 10 is a graph showing the signal levels at selected nodes of the wafer test-mode power circuit of FIG. 8 when the isolatable power node has a second initial value.

FIG. 10 is a plot of the voltages at the same nodes of the circuit 20 of FIG. 8 as plotted in FIG. 9, except that the Vss pad 102 and thus the p-type well have an initial value of −3 V. The plot of FIG. 10 shows that the transistors 104 and 106 allow the transistor 98 to become fully active even if the initial bias of the p-type well is less than the desired bias voltage of WVss.

Figure 11:
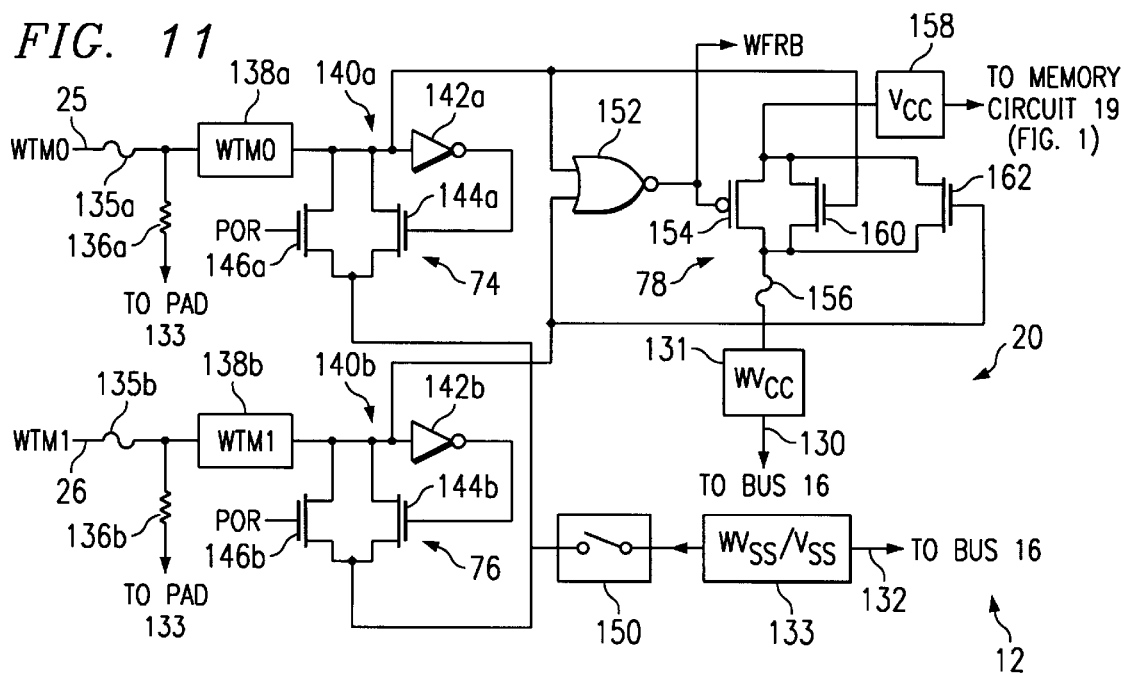
FIG. 11 is a schematic diagram of a fifth embodiment of the wafer test-mode power circuit of FIG. 1.

FIG. 11 is a schematic diagram of a fifth embodiment of the wafer test-mode power circuit 20 of FIG. 1. This embodiment of the circuit 20 is suitable for use in integrated circuits 13 that have a p-type substrate. The circuit 20 includes the latch and pull-down circuits 74 and 76, which receive WTM0 and WTM1 on lines 25 and 26 respectively. The circuit 20 also includes the power coupler circuit 78, which during wafer stressing and testing, couples WVcc via line 130 and WVcc pad 131 to a memory circuit 19 as shown in any of FIGS. 1–5. During wafer stressing and testing and normal operation, the memory circuit 19 receives power directly from a line 132 via a WVss/Vss pad 133.

More specifically, the circuit 74 includes a selectively conductive element 135a, which is coupled between the line 25 and one terminal of a pull-down resistor 136a, the other terminal of which is coupled to the WVss/Vss pad 133. As discussed above in conjunction with FIG. 8, the resistor 136a is formed from polysilicon, and has high impedance on the order of $10^{12}$ ohms. A WTM0 pad 138a is coupled between the resistor 136a and a latch circuit 140a, which includes an inverter 142a and an NMOS transistor 144a. A reset NMOS transistor 146a is coupled in parallel with the transistor 144a, and has its gate coupled to the signal POR. An optional switch 150 selectively provides power from the WVss/Vss pad 133 to the transistors 144a and 146a. Alternately, the transistors 144a and 146a are hard-wired to receive power at the desired time. The latch and pull-down circuit 76 is constructed in a manner similar to the circuit 74.

The power coupler circuit 78 includes a NOR gate 152, a PMOS transistor 154, a selectively conductive element 156, and an isolatable Vcc pad 158, which are all coupled in a manner that is similar to the coupling of the components of the power circuit 20 of FIG. 2. Additionally, the circuit 78 includes a pair of NMOS transistors 160 and 162, which are coupled in parallel to the transistor 154 and have their gates respectively coupled to WTM0 and WTM1.

During the wafer-level stressing and testing of the memory circuit 19, WTM0 and WTM1 have logic values that correspond to the stressing and testing states of the memory circuit 19 as shown in Table 1.

In operation during wafer-level stressing and testing, when one or both of WTM0 and WTM1 is logic 1, the switch 150 is open, and thus uncouples the transistors 144a and 146a of the circuit 74 from WVss. If the optional switch 150 is omitted, then the transistors 144a and 146a have no connection to WVss. Because the latch 140a is not powered, and because of the high impedance of the resistor 136a, the drive circuitry coupled can pull up the line 25 to logic 1 by sourcing a relatively small current. The latch and pull-down circuit 76 operates in a manner similar to that of the circuit 74.

Furthermore, the output of the NOR gate 152 is logic 0, which activates the PMOS transistor 154. Before the transistor 154 is fully activated, however, the isolatable Vcc pad 158, and thus the n-type well in which the transistor 154 is formed, may be electrically floating, i.e., the voltage level of the pad 158 and n-type well may be indeterminate. In some circumstances, such an indeterminate voltage level of the n-type well affects the threshold of the transistor 154 in an undesirable manner such that the transistor 154 may not fully activate when the output of the NOR gate 152 is logic 0. The NMOS transistors 160 and 162, however, are formed in the p-type substrate, which is coupled to the pad 133 so as to be biased to WVss. Because the pad 133 is directly coupled to the path 132 and thus to WVss, the thresholds of the transistors 160 and 162 are at respective desired values. Furthermore, because at least one of WTM0 and WTM1 is logic 1, at least one of the transistors 160 and 162 is active. The active one or both of the transistors 160 and 162 provides a sufficient coupling between the WVcc pad 131 and the isolatable Vcc pad 158 such that the threshold of the PMOS transistor 154 is sufficient to allow full activation of the transistor 154 when the output of the NOR gate 152 is logic 1. The NOR gate 152 operates properly when the n-wells are at an indeterminate voltage level because the transistors (not shown) of the gate 152 that generate the logic 0 output are NMOS transistors that are formed in the p-type substrate. As discussed above in conjunction with the transistors 160 and 162, because these transistors are formed in the substrate, their thresholds are at respective desired values.

The fully active transistor 154 couples WVcc to the memory circuit 19. Thus, the memory circuit 19 receives power so that it can operate in the various test modes as dictated by WTM0 and WTM1. As discussed above in conjunction with FIGS. 2, 4, 5, and 8, at the beginning of the wafer test, the testing station monitors the total current that the circuits 13 draw from WVcc and WVss. If the total current draw is excessive due to a short circuit or other defect, then circuits 13 are tested individually or in another conventional manner to determine which one or ones are defective, and the element 156 is made nonconductive in all the defective circuits 13.

During normal operation of the memory circuit 19, the levels on both pads 138a and 138b are logic 0. The switch 150 closes to couple the pad 133 to the sources of the transistors 144a and 146a of the circuit 74. In response to POR being logic 1 during the initialization of the memory circuit 19, the latch 140a operates in a manner similar to that of the latch 66 of FIG. 7 to maintain the pad 138a at logic 0. The latch 140b of the circuit 76 operates in a similar manner to maintain the pad 138b at logic 0. The switch 150 may be controlled with the signal levels on the pads 138a and 138b, or may be controlled by other conventional circuitry such that the switch 150 is open during wafer stressing and testing and is closed during normal operation of the memory circuit 19. Alternatively, in embodiments of the circuit 20 that lack the optional switch 150, the sources of the transistors 144a and 146a are hard-wired to the pad 133 or to another external or internal pad or node that is coupled to Vss.

Furthermore, with the levels on pads 138a and 138b being logic 0, the transistors 160 and 162 are inactive, and the NOR gate 152 generates at its output a logic 1, which deactivates the transistor 154. Thus, the memory circuit 19 is fully uncoupled from the line 130 and the pad 131.

Equating the normal mode of operation with WTM0=WTM1=logic 0 provides the same advantages as discussed above in conjunction with the circuit 20 of FIG. 2. Furthermore, after the completion of the wafer-level stressing and testing, the elements 135a, 135b, and 156 in all of the circuits 13 may be made nonconductive to further ensure that the lines 25, 26, and 130 are electrically isolated from the memory circuit 19.

Figure 12:
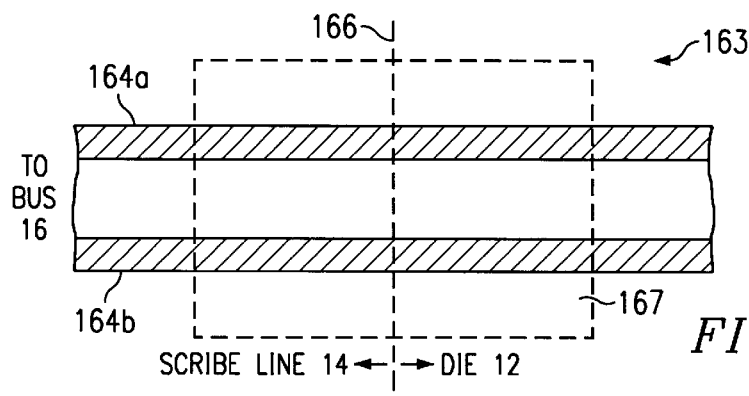
FIG. 12 is a top view of a first portion of one embodiment of an end-of-die structure for the dies of FIGS. 1–5.

FIG. 12 is a top view of a semiconductor structure 163 for providing one or more conductive paths 164a and 164b, such as lines 21, 24, 25, and 26 of FIG. 2, that extend from a die 12 to the bus 16 on the scribe line 14 of the wafer 10 of FIG. 1. The dashed line 166 represents the edge of the die 12 after it has been scribed from the wafer 10. That is, the dashed line 166 represents the actual location where the cut is made to separate the die 12 from the wafer 10. In one embodiment of the invention, the lines 164a and 164b are formed in a first layer of polysilicon, and are covered by a second layer 167 of polysilicon. Although two paths 164a and 164b are shown, it is understood that more or fewer of such conductive paths may be formed on the die 12 and on the scribe line 14.

Figure 13:
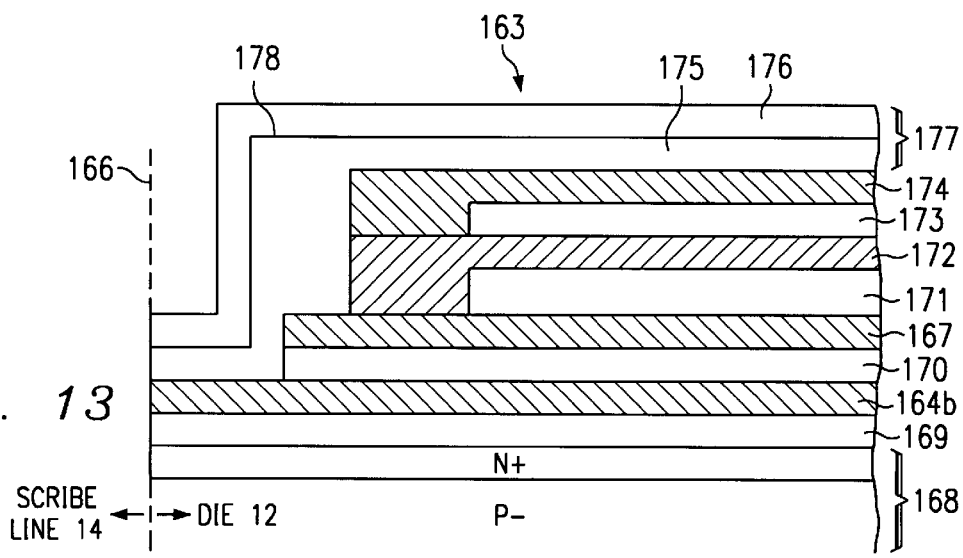
FIG. 13 is a side view of the first portion of the end-of-die structure of FIG. 12.

FIG. 13 is a side view of the semiconductor structure 163 of FIG. 12. The die 12 includes a substrate 168, which in the illustrated embodiment of the invention includes a first p− region and a second, optional, n+ region, a first insulator layer 169, the conductive path 164b formed in a first polysilicon layer, a second insulator layer 170, the second layer of polysilicon 167, a third insulator layer 171, a first metal layer 172, a fourth insulator layer 173, a second metal layer 174, and layers 175 and 176, which together form a passivation, i.e., protective, layer 177.

During formation of the die 12 of the wafer 10, after formation of all the layers except the passivation layer 177, the second polysilicon layer 167 and the insulator layer 170 are etched to form an outer portion of an edge 178. Next, the metal layers 172 and 174 are etched near to the anticipated edge of the die 12 to form an inner portion of the edge 178. During this etch, the extension of the second polysilicon layer 167 acts as an etch stop to prevent etching beyond the metal layers 172 and 174, which are coupled together along the inner portion of the edge 178. Thus, the conductive paths 164a (FIG. 12) and 164b and the insulator layer 169 are not etched, and continue beyond the edge 166 of the die 12 to the bus 16. The protective layer 176 is then formed as shown to cover and seal the layers 168, 170, 172, and 174 along the inner and outer portions of the edge 178, but to allow the paths 164a and 164b to extend beyond the edge 166 of the die 12 to the bus 16 in the scribe line 14 of the wafer 10. In an alternative embodiment of the invention, the paths 164a and 164b may be omitted, and one or more conductive paths may be formed in the optional n+ active area of the substrate 168. Such conductive paths also extend beyond the edge 166 of the die 12 to the bus 16.

After the die 12 is scribed from the wafer 10, the end portions of the conductive paths 164a and 164b adjacent to the die edge 166 are often exposed. Likewise, a conductive path formed in the optional n+ region of the substrate 168 will also be exposed at the die edge 166. The exposure of the conductive paths 164a and 164b, however, typically does not cause any problems with the operation of the memory circuit 19 of FIG. 2. Alternatively, the exposed portions of the paths 164a and 164b may be sealed or covered in a conventional manner.

The polysilicon paths 164a and 164b and the second polysilicon layer 167 are formed in a conventional manner. Likewise, the insulator layers 169, 170, 171, and 173 are formed from silicon dioxide or other insulator materials in a conventional manner. The metal layers 172 and 174 are formed from aluminum or other metals in a conventional manner. The layers 175 and 176 are formed from silicon dioxide, boron-phosphorous-silicon glass (BPSG), or other insulator materials in a conventional manner.

Figure 14:
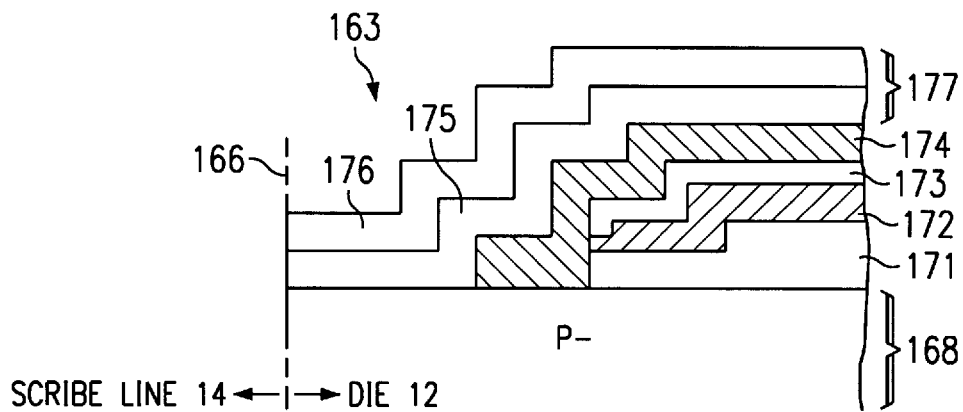
FIG. 14 is a side view of a second portion of the end-of-die structure for the dies of FIGS. 1–5.

FIG. 14 shows the edge-of-die structure 163 of FIGS. 12 and 13 in regions other than where the conductive paths 164a and 164b are formed. In these regions, the extensions i.e., outer regions, of the metal layers 172 and 174 contact the substrate 168 in a conventional manner. This structure is the same in the alternative embodiment where the conductive paths that connect to the bus 16 are formed in the optional n+ region of the substrate 168.

Figure 15:
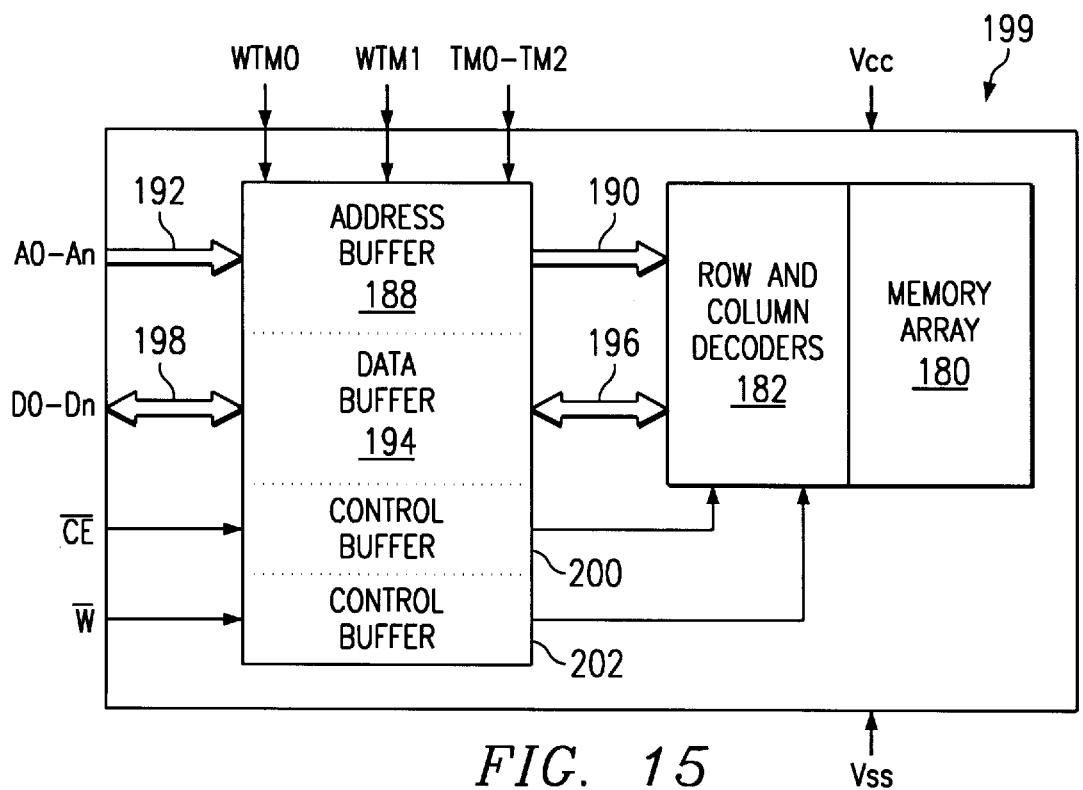
FIG. 15 is a schematic diagram of the memory circuit of FIGS. 2–5.

FIG. 15 is a block diagram of one embodiment of the memory circuit 19 of FIGS. 1–5. The memory circuit 19 includes an array 180 of memory cells that are arranged in rows and columns. Memory cells within the memory array 180 are selected by the row and column decoders 182, which are controlled by signals generated by the address buffers 188 and transmitted to the decoders 182 via an internal address bus 190. The address buffer 188 receives external address signals A0–An via an external address bus 192. A data buffer 194 transfers data to and from the memory array 180 via the bi-directional data buses 196 and 198. Signals chip enable ($\overline{CE}$) and write enable ($\overline{W}$) respectively pass through control buffers 200 and 202. All the buffers 188, 194, 200, and 202 receive the signals WTM0 and WTM1 and other test-mode signals TM0–TM2. These test signals, during various test modes of the memory device 19, force the outputs of the buffers 188, 194, 200, and 202 to desired logic values so as to control the decoders 182 and the memory array 180 in a desired fashion. For example, with the appropriate combination of signals WTM0 and WTM1, or signals TM0–TM2, it is possible to select all of the row and columns in the memory array 180 so as to simultaneously write a predetermined data value into the entire array 180 of memory cells as discussed above in conjunction with FIGS. 2, 4, 5, 8, and 11, and Tables 1 and 2. Likewise, one may simultaneously unselect all of the memory cells in the memory array 180 as discussed above.

Figure 16:
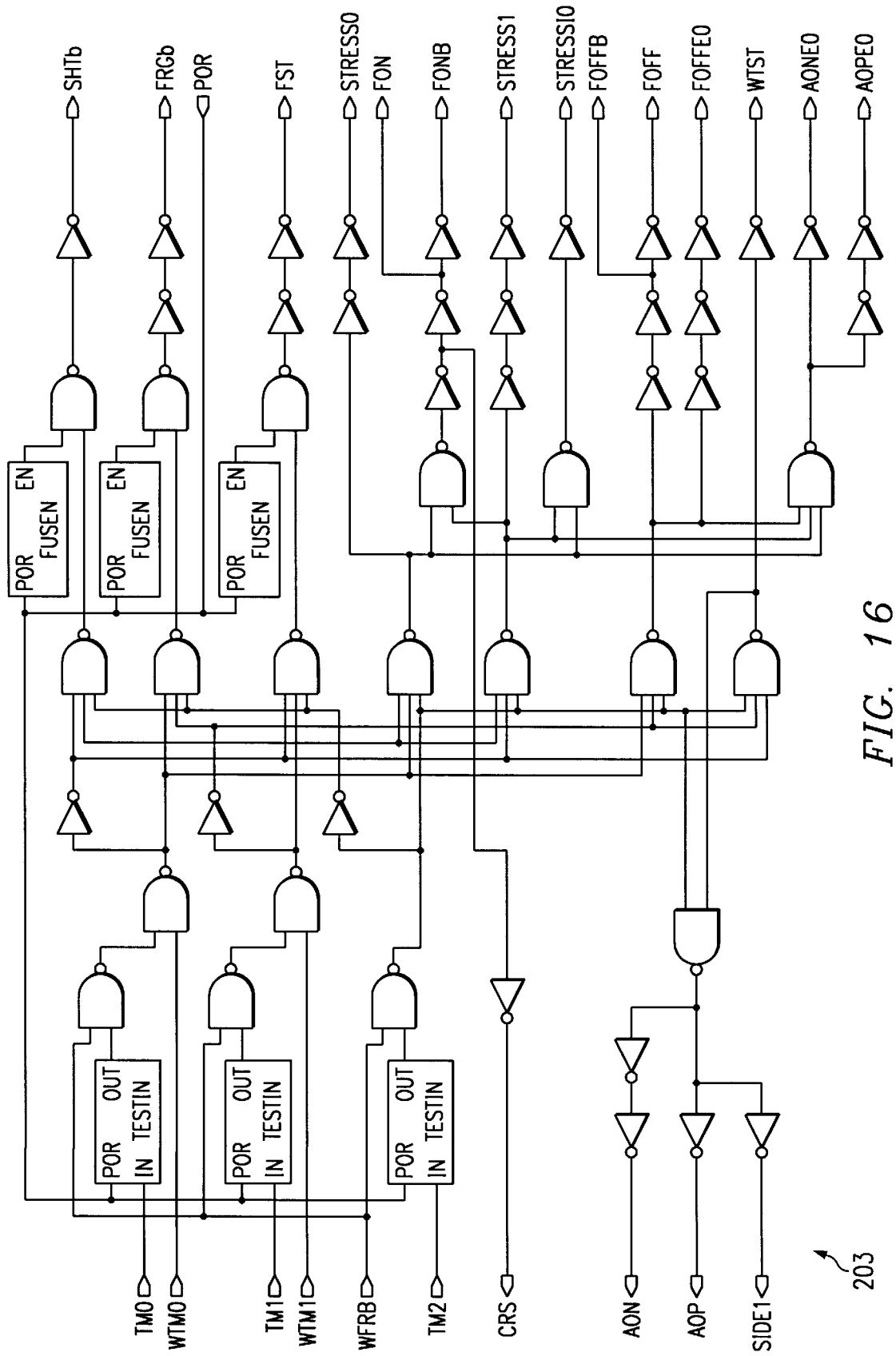
FIG. 16 is a schematic diagram of one embodiment of the buffer circuitry for the memory circuit of FIG. 15.

FIG. 16 is a schematic diagram of a stress-mode logic circuit 203 that composes a portion of one or more of the buffers 188, 194, 200, and 202 of FIG. 15. The logic circuit 203 receives WTM0, WTM1, TM0, TM1, and TM2, as well as the signal WFRB from the wafer test-mode power circuits 20 of FIGS. 8 and 11, and generates test-mode control signals that control the operation of the buffers 188, 194, 200, and 202, and thus the operation of the decoders 182 and the memory array 180. As discussed above, the signals WTM0 and WTM1 are used during a wafer-level stressing and testing of the memory circuit 19. The signals TM0, TM1, and TM2 are used during other test modes of the memory circuit 19 before and after the die 12, on which the memory circuit 19 is formed, has been scribed from the wafer 10.

Figure 17:
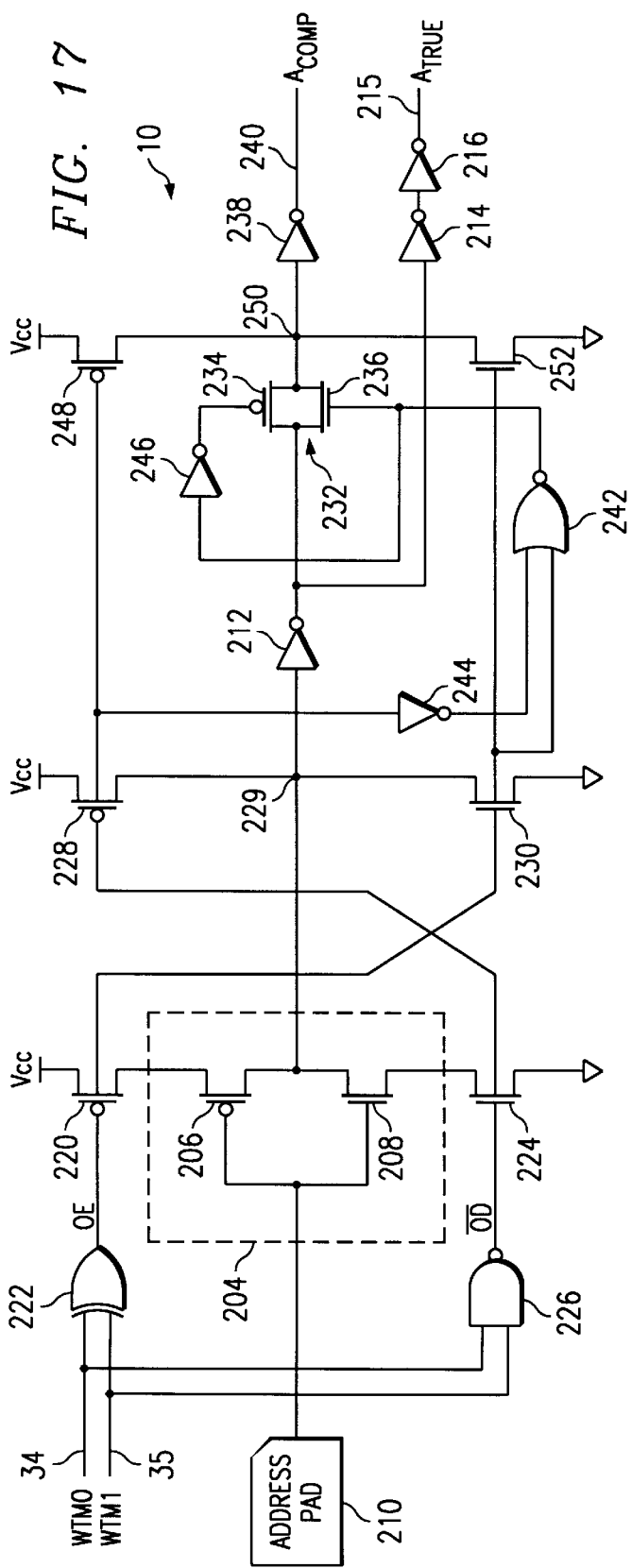
FIG. 17 is a schematic diagram of one embodiment of the address buffer for the memory circuit of FIG. 15.

FIG. 17 is a schematic diagram of one embodiment of a portion of the address buffer 188 of FIG. 15 that corresponds to one of the address signals A0–An. An inverter 204, which includes a PMOS transistor 206 and an NMOS transistor 208, has its input coupled to one address pad 210 that receives one of the address bits A0–An of the address signal. Inverters 212, 214, and 216 are serially coupled between the output of the inverter 204 and an address-true output signal line 218. The source of the transistor 206 is coupled to a pull-up PMOS transistor 220, which is driven by a signal output enable (OE). An exclusive-OR (XOR) gate 222 generates OE in response to TM0 and TM1. The source of the transistor 208 is coupled to a pull-down NMOS transistor 224, which is driven by a signal output disable ($\overline{OD}$). A NAND gate 226 generates $\overline{OD}$ in response to TM1 and TM0. A PMOS pull-up transistor 228 is driven by $\overline{OD}$ and has its drain coupled to a node 37. A pull-down transistor 230 has its gate coupled to receive OE and has its drain coupled to the node 37.

A pass gate 232, which includes PMOS transistor 234 and NMOS transistor 236, has an input that is coupled to the output of the inverter 212. An inverter 238 is coupled between the output of the pass gate 232 and a complementary output signal line 240. In one embodiment of the invention, the lines 218 and 240, which respectively carry signals $A_{true}$ and $A_{comp}$, are input to an address decoder that may be part of the address buffer 188 or the row and column decoders 182 of FIG. 15. A NOR gate 242 receives at one input terminal OE and at the other input terminal receives via an inverter 244 the inverted version of $\overline{OD}$. The output of the NOR gate 242 is directly coupled to the gate of the NMOS transistor 236 and is coupled to the gate of the PMOS transistor 234 via an inverter 246. A PMOS transistor 248 has its gate coupled to receive $\overline{OD}$ and its drain coupled to a node 250. An NMOS transistor 252 has its gate coupled to receive OE and its drain coupled to the node 250.

During normal operation of the address buffer 114 when both WTM0 and WTM1 are logic 0, OE is logic 0 and $\overline{OD}$ is logic 1. Thus, OE and $\overline{OD}$, respectively, cause the pull-up transistor 220 and the pull-down transistor 224 to be turned on, so that the address signal present on the address pad 210 is inverted by the inverter 204 and then coupled to the node 229. The pull-up and pull-down transistors 228 and 230 are both off, so the signal on node 229 is inverted by the inverter 212 and then coupled to the pass gate 232. The pass gate 232 is on so that the signal at its input passes through to the node 250. The pull-up and pull-down transistors 248 and 252, which are coupled to the node 250, are both off, so the signal at the output of the pass gate 232 is inverted by the inverter 238 to generate the signal $A_{comp}$. The signal at the output of the inverter 212 also is respectively inverted by the inverters 214 and 216 to generate the signal $A_{true}$. The inverters 214 and 216 are used to increase the drive capacity for the signal $A_{true}$. Thus, during normal operation of the memory circuit 19, the signal $A_{true}$ has the same logic value as the address bit on the pad 210, and the signal $A_{comp}$ has a signal level that is complementary to the address signal on the pad 210.

During a first test mode of operation when WTM0 is logic 0 and WTM1 is logic 1, both OE and $\overline{OD}$ are logic 1. Thus, the pull-up transistor 220 is off and the pull-down transistor 224 is on. Therefore, the inverter 204 is inactive, and the node 229 is forced low to logic 0 by the active pull-down transistor 230. The pull-up transistor 228 is off. Thus, the signal $A_{true}$ is logic 1. Furthermore, the pass gate 232 is off and the pull-down transistor 252 forces the node 250 to logic 0. The pull-up transistor 248 is off. Thus, the signal $A_{comp}$ is also logic 1. Thus, if the address decoders to which the circuit of FIG. 17 is coupled (not shown in FIG. 17) include NAND gates, because both the signals $A_{true}$ and $A_{comp}$ equal logic 1, the outputs of all the NAND gates are logic 0. Thus, all of the rows and columns in the memory array 180 are selected in this first test mode.

During a second test mode of operation when WTM0 equals logic 1 and WTM1 is logic 0, all of the rows and columns in the memory array 180 are also all selected as in the first test mode. More specifically, both OE and $\overline{OD}$ are logic 1. Thus, the pull-up transistor 220 is off and the pull-down transistor 17 is on. The inverter 204 is inoperative and thus the node 229 is forced to logic 0 by the pull-down transistor 230 because the pull-up transistor 228 is off. Thus, the signal $A_{true}$ is logic 1. The pass gate 232 is also off and thus the node 250 is forced low to logic 0 by the active pull-down transistor 24, the pull-up transistor 248 being inactive. Thus, the inverter 238 drives the signal $A_{comp}$ to logic 1 as well. Thus, as described above for the first test mode, all of the rows and columns of memory cells in the memory array 180 are simultaneously selected.

During a third test mode of operation, both WTM0 and WTM1 are logic 1, and thus none of the rows and columns in the memory array 180 are selected. More specifically, both OE and $\overline{OD}$ are logic 0. The pull-down transistor 224 is off and thus the inverter 204 is inoperative. The pull-down transistor 230 is inactive but the pull-up transistor 228 is active and thus drives the node 229 to logic 1. Thus, the signal $A_{true}$ is logic 0. The pass gate 232 and the pull-down transistor 252 are inoperative, but the pull-up transistor 248, which is active, drives the node 250 to logic 1. Thus, the signal $A_{comp}$ is also equal to logic 0. Thus, all of the NAND gates that receive as their inputs the signals $A_{true}$ and $A_{comp}$ generate logic 1's at their outputs and thus cause all of the rows and columns in the memory array 180 to be unselected.

Although FIG. 17 shows the schematic diagram of the circuitry associated with only one address pad 210 of the address buffer 188 (FIG. 15), the structure and operation of the other portions of the circuitry that are associated with the remaining address pads are similar if not identical to the circuitry shown in FIG. 17.

Figure 18:
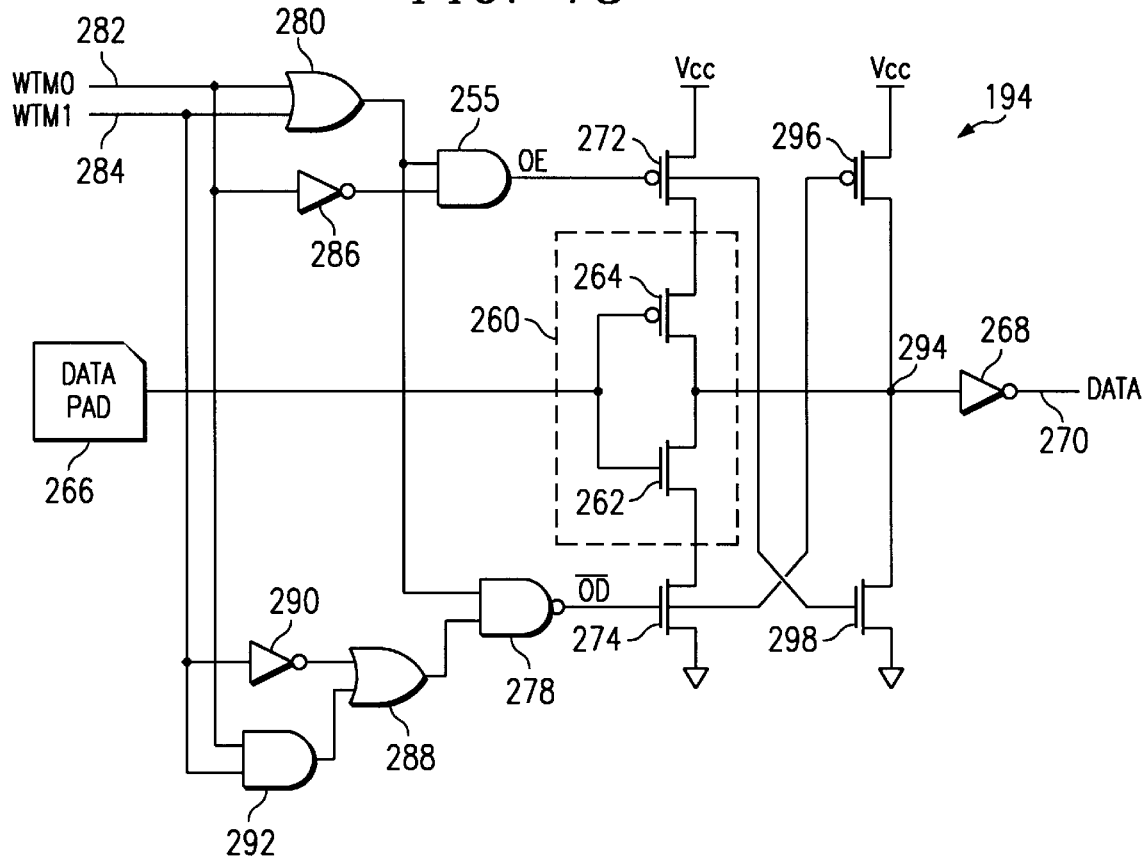
FIG. 18 is a schematic diagram of one embodiment of the data buffer for the memory circuit of FIG. 15.

FIG. 18 is a schematic diagram of one embodiment of a portion of the data buffer 194 of FIG. 15. An inverter 260, which includes an NMOS transistor 262 and a PMOS transistor 264, has its input connected to a data pad 266, which receives one of the data bits D0–Dn as shown in FIG. 15. The output of the inverter 260 is coupled to an inverter 268, which generates on a line 270 a signal DATA. The source terminal of the transistor 264 is coupled to a pull-up PMOS transistor 272, which receives at its gate a signal OE. The source terminal of the transistor 262 is coupled to a pull-down NMOS transistor 274, which has its gate coupled to receive a signal $\overline{OD}$. A first input of an AND gate 276 is coupled to a first input of a NAND gate 278 and to a signal generated at the output of an OR gate 280. The inputs of the OR gate 280 are respectively coupled to the input lines 282 and 284, which respectively carry WTM0 and WTM1. A second input of the AND gate 276 is coupled via an inverter 286 to receive WTM0. A second input of the NAND gate 278 is coupled to the output of an OR gate 288. A first input of the OR gate 288 is coupled via an inverter 290 to receive WTM1, and a second input of the OR gate 288 is coupled to the output of an AND gate 292. The inputs of the AND gate 292 are respectively coupled to receive WTM0 and WTM1.

A node 294, which is common to the output of the inverter 260 and the input of the inverter 268, is coupled to a pull-up PMOS transistor 296 and to a pull-down NMOS transistor 298. The gate of the PMOS transistor 296 is coupled to receive $\overline{OD}$ and the gate of the NMOS transistor 298 is coupled to receive OE.

During normal operation of the data buffer 194 when both WTM0 and WTM1 are logic 0, OE is logic 0 and $\overline{OD}$ is logic 1. Thus, both the pull-up transistor 272 and the pull-down transistor 274 are on so that the inverter 260 is active. The active inverter 260 inverts the signal on the data pad 266 and provides the inverted data signal to the node 294. Both of the transistors 296 and 298 are off so that the data signal on line 270 has the same signal level as the input data signal on the pad 266.

During the first test mode of operation when WTM0 is logic 0 and WTM1 is logic 1, both OE and $\overline{OD}$ are logic 1. Thus, the transistor 272 is off and the transistor 274 is on. Therefore, the inverter 260 is inactive and the node 294 is forced low to logic 0 by the active transistor 298. The transistor 296 is off. Thus, the signal DATA on the line 51 is logic 1. As discussed above in conjunction with FIG. 17, during the first test mode all of the rows and columns of the memory array 180 are selected, and the data buffer 194 writes logic 1 into all of the memory cells.

During the second test mode of operation when WTM0 is logic 1 and WTM1 is logic 0, both OE and $\overline{OD}$ are logic 0. The pull-up transistor 272 is on and the pull-down transistor 274 is off. The inverter 260 is inoperative. The pull-up transistor 296 is on and the pull-down transistor 298 is off. Thus, the pull-up transistor 296 forces the node 294 to logic 1, and the signal DATA on the line 270 is logic 0. As discussed above in conjunction with FIG. 17, during the second test mode, all the rows and columns of memory cells in the memory array 180 are selected. Thus, the data buffer 194 writes logic 0 into all of the memory cells.

During the third test mode of operation when WTM0 and WTM1 are logic 1, both OE and $\overline{OD}$ are logic 0. Thus, the data buffer 194 is driven to a condition equivalent to that described above for the second test mode of operation. That is, in the third test mode of operation, the signal DATA on the line 270 is forced to logic 0. As discussed above in conjunction with FIG. 17, in a third test mode of operation none of the rows and columns of memory cells in the memory array 180 are selected. Thus, the data buffer 194 writes no data into the memory cells, and is in a known state of generating DATA signals having a value of logic 0.

Although FIG. 18 shows the schematic diagram of the circuitry associated with only one data pad 266 of the data buffer 194 (FIG. 15), the structure and operation of the other portions of the circuitry that are associated with the remaining data pads are similar if not identical to the circuitry shown in FIG. 18.

Figure 19:
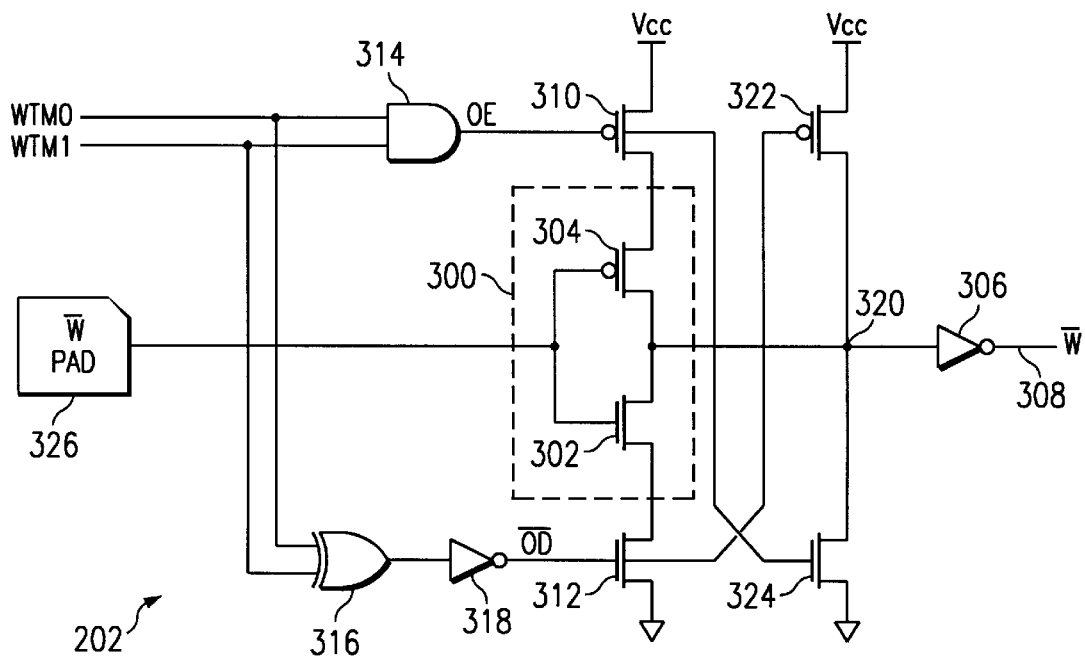
FIG. 19 is a schematic diagram of one embodiment of the signal buffers for the memory circuit of FIG. 15.

FIG. 19 is a schematic diagram of both of the control buffers 200 and 202 of the memory circuit 19 of FIG. 15. Although for clarity the circuit 202 is described, it is understood that the circuit 200 has a similar structure and operation.

The signal buffer 202 includes an inverter 300 that includes an NMOS transistor 302 and a PMOS transistor 304. An inverter 306 is coupled between the output of the inverter 300 and a signal line 308, which provides the signal $\overline{W}$. The source terminal of the transistor 304 is coupled to a pull-up PMOS transistor 310, which receives at its gate a signal OE. The source terminal of the transistor 302 is coupled to a pull-down NMOS transistor 312, which has its gate coupled to receive a signal $\overline{OD}$. An AND gate 314 receives at its two inputs WTM0 and WTM1, and generates at its output the signal OE. An XOR gate 316 receives at its two input terminals WTM0 and WTM1 and generates at its output the signal OD. An inverter 318 converts OD into the signal $\overline{OD}$. A node 320, which is common to the output of the inverter 300 and the input of the inverter 306, is coupled to a pull-up PMOS transistor 322, which has its gate coupled to receive $\overline{OD}$. The node 320 is also connected to a pull-down NMOS transistor 324, which has its gate coupled to receive OE.

During normal operation of the memory device 19, when both WTM0 and WTM1 are logic 0, OE is logic 0 and $\overline{OD}$ is logic 1. Both the pull-up transistor 310 and the pull-down transistor 314 are on so that the inverter 300 is active and inverts the signal on the input pad 326 and provides the inverted signal to the node 320. Both the pull-up transistor 322 and the pull-down transistor 324 are off such that $\overline{W}$ on the line 308 has the same logic level as $\overline{W}$ on the pad 326.

In the first test mode, when WTM0 is logic 0 and WTM1 is logic 1, both OE and $\overline{OD}$ are logic 0. The pull-up transistor 310 is on and the pull-down transistor 312 is off. Thus, the inverter 300 is inoperative. The pull-down transistor 324 is off and thus the pull-up transistor 322, which is on, drives the node 320 to logic 1. Thus, the signal $\overline{W}$ on the line 308 is logic 0. As discussed above in conjunction with FIGS. 17 and 18, in the first test mode of operation, all the rows and columns of the memory cells in the memory array 180 are selected and written with logic 1's. Thus, a logic 0 for the signal $\overline{W}$ on the line 308 enables the writing of the memory cells.

During the second test mode of operation, when WTM0 is logic 1 and WTM1 is logic 0, the signal buffer 202 also generates logic 0 for the signal $\overline{W}$ on the line 308. As discussed above in conjunction with FIGS. 17 and 18, during the second test mode of operation, all of the memory cells in the memory array 180 are written with logic 0's. Thus, the logic 0 for the signal $\overline{W}$ on the line 308 enables the writing of logic 0's to all of the memory cells in the memory array 180.

During the third test mode of operation, when both WTM0 and WTM1 are logic 1, both OE and $\overline{OD}$ are logic 1. Thus, the pull-up transistor 310 is off and the pull-down transistor 312 is on. The inverter 300 is inoperative, and thus the node 320 is forced to a logic 0 by the active pull-down transistor 324 because the pull-up transistor 322 is off. Thus, the signal $\overline{W}$ on the line 308 is logic 1. The logic 1 for the signal $\overline{W}$ disables writing to the memory cells of the memory array 180 as is consistent with the description of the third test mode given above in conjunction with FIGS. 17 and 18.

Figure 20:
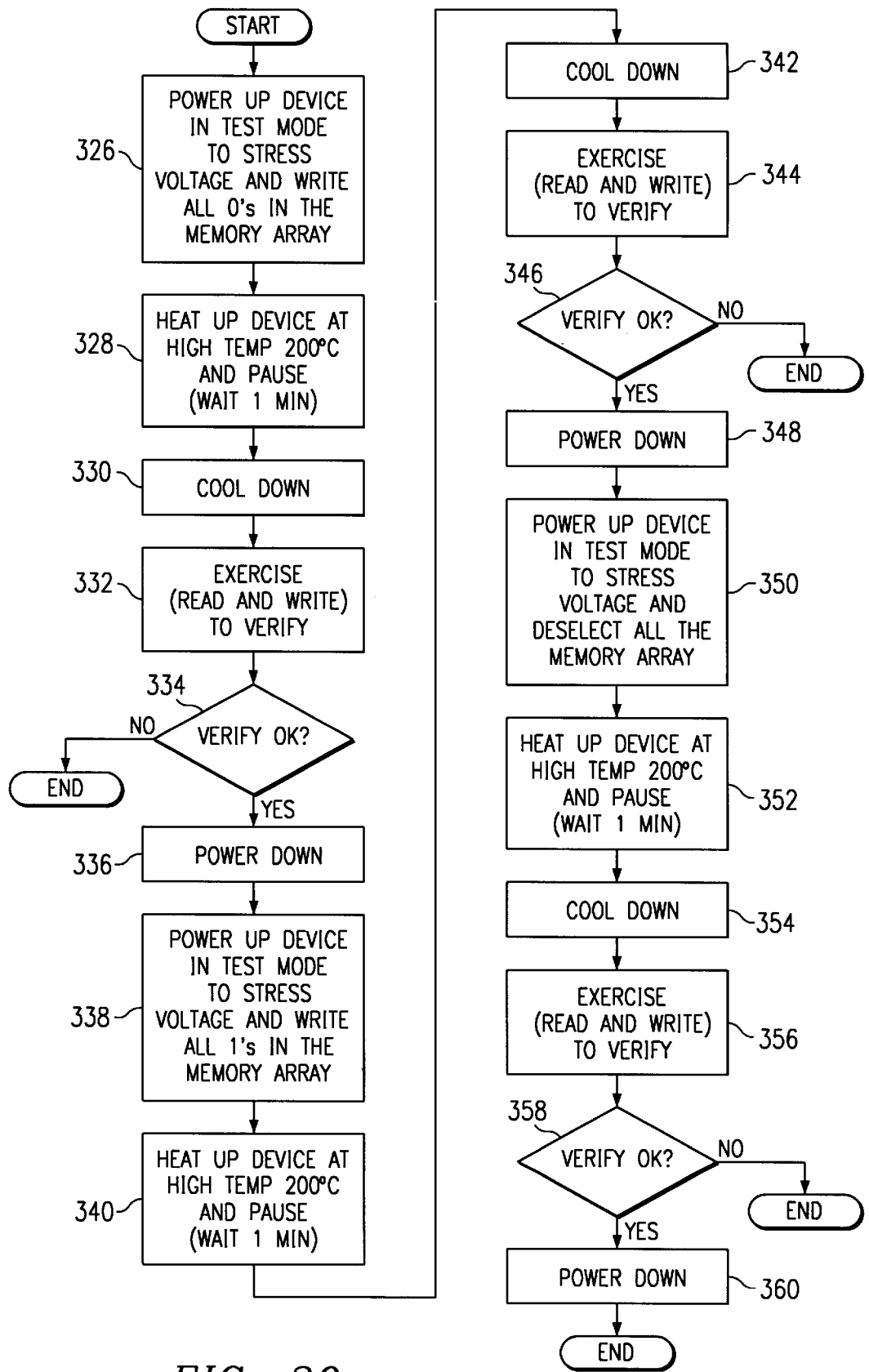
FIG. 20 is a flowchart of a stress and test procedure according to the present invention.

FIG. 20 is a flowchart of one embodiment of a stressing and testing method for the memory device 19 of FIG. 15. The described method is suitable for use with the buffer circuits of FIGS. 17–19. First, each of the dies 12 of the wafer 10 is briefly tested individually, or a few at a time, in all of the test modes to verify that it has no overcurrent condition. If an overcurrent condition is found on the die 12, the element 31 of FIG. 2 (or the elements 42, 51 and 54, 100, or 156 of FIGS. 4, 5, 8 and 11 respectively, depending upon which embodiment of the wafer test-mode power circuit 20 is used) is made nonconductive as discussed above in conjunction with FIGS. 2, 4, 5, 8, and 11 such that the defective circuits 13 are isolated from the remaining circuits 13 on the wafer 10. Furthermore, as described above in conjunction in FIG. 1, the buses 16 may be segmented such that dies 12 within a particular section of the wafer 10 can be controlled independently of the dies 12 in the remaining sections.

The stressing and testing method is described referring to a single memory device 19 of FIG. 15, it being understood that the remaining memory devices 19 are stressed and tested in the same way. According to one embodiment of the invention, the stressing and testing method consists of three test phases, where each test phase is defined by the combination of the values of WTM0 and WTM1. For example purposes, it is assumed that the memory device 19 has a p-type substrate such that the signals WTM0 and WTM1 have the values in corresponding test modes as shown in Table 1.

During the first phase of the test, the memory circuit 19 is powered up to Vcc=7 V, which is higher than the normal operating voltage of approximately Vcc=5 V. During the power up, WTM0 is driven to logic 0 and WTM1 is driven to logic 1. This combination of the WTM0 and WTM1 corresponds to the first test mode and thus the address data and control buffers 188, 194, 200 and 202 respectively cause logic 0's to be written into all of the memory cells in the memory array 180. During this first step, which is shown in block 326 of FIG. 20, the conventional bit-line loads (not shown) are disabled.

During the next step as shown in block 328, the memory circuit 19 is heated to a high temperature, in one aspect of the invention, between 200° and 250° C. This stress condition, which is maintained on the memory array 180 for a time of between several seconds to several minutes, allows testing for ionic contamination or for charge trap sites. The heating of the memory device 19 makes it easier to test for these situations because ions have a greater mobility at higher temperatures and have an increased tendency to drift based on an electric field.

The next step shown in block 330, is to cool the device to approximately room temperature, which is between 20° and 25° C.

During the next step of the test as shown in block 332, each memory cell, or a byte or word of memory cells, is written to and read from to identify failures in the memory array 180. This step is not performed simultaneously on all the memory circuits 19 of the dies 12 of the wafer 10, and thus is performed individually on each memory circuit 19, or on groups of the memory circuits 19, on a separate testing station. As shown in the decision block 334, if the memory device 19 fails the test of block 332, the memory device 19 is discarded, or indicated as a defective memory circuit on the wafer 10, and the stress test ends. If the verify step 332 is passed, the memory device 19 is powered down as shown in block 336. The powering down of the device 19 ends the first phase of the stressing and testing procedure.

The second phase of the stressing and testing procedure begins by powering up the memory circuit 19 to the same stress voltage VCC=7 V and driving WTM0 to logic 1 and WTM1 to logic 0. Thus, WTM0 and WTM1 control the address buffer 188, the data buffer 194 and the control buffers 200 and 202 such that a logic 1 is simultaneously written to all of the memory cells in the memory array 180. During this step as shown in block 338, the conventional bit-line loads are disabled. Next, as shown in block 340, the memory circuit 19 is again heated to a high temperature of approximately 200°–250° C. for a time that ranges between several seconds and several minutes. This stress condition also allows testing for ionic contamination or charge trap sites for the same reason as discussed above in conjunction with the step 328.

As shown in block 342, the memory device 19 is then cooled down to an ambient temperature of approximately 20°–25° C. Again, as in step 332 and as shown in block 344, each memory cell in the memory array 180 is written to and read from individually or in groups of bytes or words, to determine if any of the memory cells are now defective. Again, step 344 is performed on each memory circuit 19 individually or in small groups, and not on all the memory circuits 19 simultaneously. If the memory device 19 fails the step 344, the stress test ends as shown in the decision block 346. If the device 19 passes the test step 344, it is powered down, thus ending the second phase of the stress test.

The third and last phase of the stressing and testing procedure starts by again powering up the memory circuit 19 to the stress voltage VCC=7 V, while WTM0 and WTM1 are logic 1. As explained in conjunction with FIGS. 17–19, in this third test mode, none of the rows and columns in the memory array 180 are selected, all the outputs of the data buffer 194 are logic 0, and the outputs of the control buffers 200 and 202 are logic 1. Thus, the writing to the memory cells is disabled, and the logic 1 for the signal $\overline{CE}$ disables most of the circuits inside the memory circuit 19. Block 350 shows this portion of the third phase of the test. Next, as shown in block 352, the memory circuit 19 is heated to a high temperature of approximately 200°–250° C. for a predetermined amount of time ranging from several seconds to several minutes. As discussed above in steps 328 and 340, the heated stress condition allows testing for ionic contamination or charge trap sites. Next as shown in block 354, the memory device 19 is cooled down to an ambient temperature of approximately 20° to 25° C. Again, as shown in block 356, each memory cell of the memory circuit 19 is written and read to determine if any of the cells are defective. Again, this individual reading and writing of the memory cells is not performed on each of the memory circuits 19 simultaneously, but instead is performed on each memory circuit 19 individually or on groups of the memory circuits 19 on a separate testing station. As indicated by the decision block 358, if the device 19 fails the testing step 356, it is identified as defective and the stress test step ends. If the device 19 passes the step 356, it is powered down and the stress test ends.

In another embodiment of the invention, in order to enhance the oxide stressing, an additional oxide stress step is performed after the cooling steps 330, 342, and 354 and before the individual reading and writing of the memory cells as shown in blocks 332, 344, and 356 respectively. This enhanced oxide stressing step may be performed in all three phases of the testing and stressing method, or in only one or two of the phases.

The enhanced oxide stressing step entails cooling the device to an intermediate temperature, for example 80° C. and raising the supply voltage Vcc to a higher stress voltage, for example 9 V, and maintaining these conditions for a predetermined amount of time, for example, 1 second. It is believed that this step improves the stress tolerance of all oxides in the memory circuit 19.

The above described method for parallel stress testing of integrated circuit dies, together with the above described memory circuits 19, provides a method for detecting latent defects within the memory array 180 as well as within the decoders 182, the periphery circuits such as the buffers 188, 194, 200 and 202. By using DC voltages during the test, as compared to conventional dynamic testing at elevated temperatures using AC signals, a latchup phenomena is reduced or eliminated and testing for ionic contamination and charge trap sites is possible.

Furthermore, the described testing and stressing method saves a significant amount of time compared to conventional methods, because it performs, at wafer level, a complete stress test that would otherwise be performed on each memory circuit 19 singularly after the dies 12 had been scribed from the wafer 10, or even after the dies 12 had been packaged. Thus, all of the stress testing can be performed in a few minutes or even a few seconds instead of the several hours necessary for most conventional burn in methods. Also, the testing equipment used to perform this test method may be less complex than conventional testing equipment because during the described test, all of the integrated circuit dies 12 are controlled simultaneously and by only four lines, for example lines 21, 24, 25, and 26 of FIG. 2, of which two lines, here 21 and 24, are for power, and the remaining two lines, here 25 and 26, are for control signals WTM0 and WTM1.

Although the method has been described by applying the three phases in the described order, writing all 0's to the memory array, then writing all 1's to the memory array and then unselecting the memory array, other combinations or subsets of the three test phases may be used.

For example, the sequencing of the test phases may be altered as follows: first step unselect the memory array, second step write all 0's into the memory array, third step write 1's to all the memory cells in the memory array.

Additionally, the stressing time, the stress voltage Vcc applied to the circuitry, and the temperature are dependent parameters, and they can vary between certain limits. For example, testing for a longer time at a higher voltage may allow a reduced temperature, or a higher voltage and a higher temperature may allow a reduced testing time.

Furthermore, the verification processes may all be done at the end of all of the three test phases, so that the three test phases can be done consecutively on a first test station, and then the verification processes can be done consecutively on a second test station. Thus, the wafer 10 need only be transferred once between the first and second test stations.

The above-described testing method is very flexible, and may be varied to meet the needs of the user.

FIG. 21 is a block diagram of a computer system 362, which incorporates an integrated circuit 13 of any of FIGS. 1–5, that includes the memory circuit 19 of FIG. 15. The computer system 362 includes computer circuitry 364 for performing computer functions, such as executing software to perform desired calculations and tasks. The computer circuitry 364 typically includes a processor 366 and the integrated circuit 13 having the memory circuit 19, which is coupled to the processor 366. One or more input devices 368, such as a keypad or a mouse, are coupled to the computer circuitry 364 and allow an operator (not shown) to manually input data thereto. One or more output devices 370 are coupled to the computer circuitry 364 to provide to the operator data generated by the computer circuitry 364. Examples of such output devices 370 include a printer and a video display unit.

One or more data-storage devices 372 are coupled to the computer circuitry 364 to store data on or retrieve data from external storage media (not shown). Examples of the storage devices 372 and the corresponding storage media include drives that accept hard and floppy disks, tape cassettes and compact disc read-only memories (CD-ROMs). Typically, the computer circuitry 364 includes address, data, and control buses that are respectively coupled to the address, data, and control buses of the memory circuit 19.

From the foregoing, it will be appreciated that although specific embodiments of the invention have been described herein for purposes of illustration, various modifications may be made without deviating from the spirit and scope of the invention. Accordingly, the invention is not limited except as by the appended claims.

I claim:
1. A semiconductor wafer, comprising:
a scribe line having first and second conductive paths; and
a plurality of integrated-circuit dies each having a die edge that is adjacent to said scribe line and each including,
a substrate of semiconductor material that is contiguous with said die edge,
a first conductive layer disposed on said substrate,
a first insulator layer that is disposed between said substrate and said conductive layer,
a protective layer that is disposed on said conductive layer and that extends to said die edge,
third and fourth conductive paths that are disposed beneath said insulator layer and are respectively coupled to said first and second conductive paths, a signal node that is disposed in said die and coupled to said third conductive path, a supply node that is disposed in said die and coupled to said fourth conductive path, an isolatable supply node that is disposed in said die, a functional circuit that is disposed in said die and coupled to said isolatable supply node, and a switch circuit that is disposed in said die, said switch circuit having a control terminal that is coupled to said signal node and having a switchable path that is coupled between said supply node and said isolatable supply node.

2. The semiconductor wafer of claim 1 wherein each of said integrated-circuit dies further comprises:

a metal layer that is disposed on said first conductive layer, said metal layer having an edge portion that is covered by said protective layer, and said metal layer and said protective layer contacting regions of said substrate adjacent to said die edge other than the region of said substrate where said conductive path extends beneath said protective layer.

3. The semiconductor wafer of claim 1 wherein said third and fourth conductive paths are disposed in said substrate.

4. The semiconductor wafer of claim 1 wherein each integrated-circuit die further comprises:

a second insulator layer disposed between said substrate and said first insulator layer;

a second conductive layer disposed between said first and second insulator layers; and said third and fourth conductive paths disposed in said second conductive layer.

5. The semiconductor wafer of claim 1 wherein each integrated-circuit die further comprises:

a second insulator layer disposed between said substrate and said first insulator layer;

a second conductive layer disposed between said first and second insulator layers;

said third and fourth conductive paths disposed in said second conductive layer, and said protective layer contacting said substrate along regions of said die edge other than the regions of said die edge where said third and fourth conductive paths are disposed between said protective layer and said substrate.

6. A semiconductor wafer, comprising:

a scribe line having first and second conductive paths; and a plurality of memory dies each having a die edge that is adjacent to said scribe line and each including, a substrate of semiconductor material that is contiguous with said die edge;

a first conductive layer disposed on said substrate;

a first insulator layer that is disposed between said substrate and said conductive layer;

a protective layer that is disposed on said conductive layer and that extends to said die edge;

third and fourth conductive paths that are disposed beneath said insulator layer and respectively coupled to said first and second conductive paths;

a signal node that is disposed in said die, said signal node coupled to said third conductive path;

a supply node that is disposed in said die, said supply node coupled to said fourth conductive path;

an isolatable supply node that is disposed in said die;

an array of memory cells that is disposed in said die, said array coupled to said signal node and to said isolatable supply node;

an address decoder that is disposed in said die, said address decoder coupled to said array, said signal node, and said isolatable supply node, said address decoder operable to select an addressed one of said memory cells;

an address buffer that is disposed in said die, said address buffer coupled to said address decoder, said signal node, and said isolatable supply node, said address buffer operable to control said address decoder;

a data buffer that is disposed in said die, said data buffer coupled to said array of memory cells, said signal node, and said isolatable supply node, said data buffer operable to read data from and write data to said array; and a switch circuit that is disposed in said die, said switch circuit having a control terminal that is coupled to said signal node and having a switchable path that is coupled between said supply node and said isolatable supply node.

7. The semiconductor wafer of claim 6 wherein said second and third conductive paths are disposed in said substrate.

8. The semiconductor wafer of claim 6 wherein each of the memory dies further comprises:

a second insulator layer disposed between said substrate and said first insulator layer;

a second conductive layer disposed between said first and second insulator layers; and said third and fourth conductive paths disposed in said second conductive layer.

9. The semiconductor wafer of claim 6 wherein each of said memory dies further comprises:

a second insulator layer disposed between said substrate and said first insulator layer;

a second conductive layer disposed between said first and second insulator layers;

said third and fourth conductive paths disposed in said second conductive layer; and said protective layer contacting said substrate along regions of said die edge other than the regions of said die edge where said third and fourth conductive paths are disposed between said protective layer and said substrate.

* * * * *